United States Patent
Yamada et al.

(10) Patent No.: US 10,790,146 B2
(45) Date of Patent: Sep. 29, 2020

(54) AROMATIC RESINS FOR UNDERLAYERS

(71) Applicant: Rohm and Haas Electronic Materials LLC, Marlborough, MA (US)

(72) Inventors: Shintaro Yamada, Shrewsbury, MA (US); Li Cui, Westborough, MA (US); Christopher Gilmore, Natick, MA (US); Joshua A. Kaitz, Watertown, MA (US); Sheng Liu, Bow, NH (US); James F. Cameron, Brookline, MA (US); Suzanne M. Coley, Mansfield, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 15/802,089

(22) Filed: Nov. 2, 2017

(65) Prior Publication Data
US 2018/0158674 A1 Jun. 7, 2018

Related U.S. Application Data

(60) Provisional application No. 62/429,926, filed on Dec. 5, 2016.

(51) Int. Cl.
*H01L 21/027* (2006.01)
*G03F 7/11* (2006.01)
(Continued)

(52) U.S. Cl.
CPC ........ *H01L 21/0276* (2013.01); *C09D 171/00* (2013.01); *G03F 7/0752* (2013.01); *G03F 7/091* (2013.01); *G03F 7/094* (2013.01); *G03F 7/11* (2013.01); *H01L 21/0332* (2013.01); *H01L 21/3081* (2013.01); *G03F 7/16* (2013.01); *G03F 7/20* (2013.01); *G03F 7/30* (2013.01); *H01L 21/3065* (2013.01); *H01L 21/31116* (2013.01); *H01L 21/31138* (2013.01)

(58) Field of Classification Search
CPC ..... H01L 21/0276; C09D 171/00; G03F 7/11; G03F 7/20; G03F 7/30; G03F 7/16
See application file for complete search history.

(56) References Cited

U.S. PATENT DOCUMENTS 5,965,679 A * 10/1999 Godschalx ............. C08G 61/10
526/281
6,235,629 B1 * 5/2001 Takenaka .......... H01L 21/76808
257/E21.579
(Continued)

FOREIGN PATENT DOCUMENTS

EP 2990430 A1 3/2016
JP 2001348422 A 12/2001
(Continued)

OTHER PUBLICATIONS

Stille (The Cross-Linking of Thermally Stable Aromatic Polymers by Aryl Cyanate Cyclotrimerization. Macromolecules. 9(3), 1976, pp. 516-523). (Year: 1976).*
(Continued)

*Primary Examiner* — Cory W Eskridge
(74) *Attorney, Agent, or Firm* — Jonathan D. Baskin

(57) ABSTRACT

Aromatic resin polymers and compositions containing them are useful as underlayers in semiconductor manufacturing processes.

14 Claims, 2 Drawing Sheets

(51) Int. Cl.
  *C09D 171/00* (2006.01)
  *H01L 21/033* (2006.01)
  *H01L 21/308* (2006.01)
  *G03F 7/09* (2006.01)
  *G03F 7/075* (2006.01)
  *G03F 7/30* (2006.01)
  *G03F 7/16* (2006.01)
  *G03F 7/20* (2006.01)
  *H01L 21/311* (2006.01)
  *H01L 21/3065* (2006.01)

(56) References Cited

U.S. PATENT DOCUMENTS

| | | | |
|---|---|---|---|
| 6,288,188 B1 | 9/2001 | Godschalx et al. | |
| 6,646,081 B2 | 11/2003 | Godschalx et al. | |
| 7,109,249 B2 | 9/2006 | Bruza et al. | |
| 7,115,531 B2 | 10/2006 | Shaffer, II et al. | |
| 7,888,397 B1 | 2/2011 | Hibbs et al. | |
| 8,110,636 B1 | 2/2012 | Fujimoto et al. | |
| 8,846,846 B2 * | 9/2014 | Kinsho | G03F 7/091 |
| | | | 528/128 |
| 9,040,232 B2 * | 5/2015 | Minegishi | H01L 21/31144 |
| | | | 430/323 |
| 9,146,468 B2 * | 9/2015 | Hatakeyama | H01L 21/0271 |
| 9,412,593 B2 * | 8/2016 | Namai | C08L 47/00 |
| 2003/0099828 A1 | 5/2003 | Cho et al. | |
| 2005/0176915 A1 | 8/2005 | Cho et al. | |
| 2006/0267000 A1 | 11/2006 | Godschalx et al. | |
| 2007/0023916 A1 * | 2/2007 | Hah | G03F 7/091 |
| | | | 257/758 |
| 2009/0247701 A1 | 10/2009 | Inabe | |
| 2010/0222432 A1 | 9/2010 | Hua | |
| 2016/0060393 A1 | 3/2016 | Gilmore et al. | |
| 2016/0168419 A1 | 6/2016 | Gilmore et al. | |
| 2018/0157175 A1 * | 6/2018 | Liu | G03F 7/0384 |

FOREIGN PATENT DOCUMENTS

| | | |
|---|---|---|
| JP | 2009231679 A | 10/2009 |
| WO | 8707286 A1 | 12/1987 |
| WO | 9318076 A1 | 9/1993 |
| WO | 9710193 A1 | 3/1997 |
| WO | 9811149 A1 | 3/1998 |
| WO | 0031183 A1 | 6/2000 |
| WO | 2004073824 A2 | 9/2004 |

OTHER PUBLICATIONS

U.S. Co-pending U.S. Appl. No. 15/056,652, filed Feb. 29, 2016.
Kumar, et al, "Diels-Alder Polymerization Between Bis(cyclopentadienones), and Acetylenes. A Versatile Route to New Highly Aromatic Polymers," Macromolecules, 1995, vol. 28, pp. 124-130.
Fujimoto, et al, "Ionomeric poly(phenylene) prepared by Diels-Alder polymerization: synthesis and physical properties of a novel polyelectrolyte", Macromolecules, 2005, vol. 38, pp. 5010-5016.
Lim, et al, "Synthesis and properties of sulfonated poly(phenylene sulfone)s without ether linkage by Diels-Alder reaction for PEMFC application", Electrochimica Acta, 2014, vol. 119, pp. 16-23.
Search report for corresponding China Application No. 201711169511.6 dated Aug. 5, 2019.

* cited by examiner

| | | |
|---|---|---|
| PR | | |
| CD (nm) | 96.44 | 104.26 |
| SiARC open | | |
| CD (nm) | 112.81 | 120.82 |
| SOC open | | |
| CD (nm) | 116.28 | 123.45 |
| Si open | | |
| CD (nm) | 113.72 | 120.09 |

AROMATIC RESINS FOR UNDERLAYERS

The present invention relates generally to the field of manufacturing electronic devices, and more specifically to the field of materials for use in semiconductor manufacture.

It is well-known in lithographic processes that a resist pattern can collapse due to surface tension from the developer used if the resist pattern is too tall (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, such as different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

The incumbent technologies for underlayer include chemical vapor deposited (CVD) carbon and solution processed high-carbon content polymers. The CVD materials have several significant limitations including high cost of ownership, inability to form a planarizing layer over topography on a substrate, and high absorbance at 633 nm which is used for pattern alignment. For these reasons, the industry has been moving to solution processed high-carbon content materials as underlayers. The ideal underlayer needs to meet the following properties: capable of being cast onto a substrate by a spin-coating process, thermal-set upon heating with low out-gassing and sublimation, soluble in common processing solvents for good equipment compatibility, have appropriate n/k ratio to work in conjunction with currently used silicon hardmask and bottom antireflectant (BARC) layers to impart low reflectivity necessary for photoresist imaging, and be thermally stable up to >400° C. so as to not be damaged during subsequent silicon-oxynitride (SiON) CVD processes.

It is well-known that materials of relatively low molecular weight have relatively low viscosity, and flow into features in a substrate, such as vias and trenches, to afford planarizing layers. Underlayer materials must be able to planarize with relatively low out-gassing up to 400° C. For use as a high-carbon content underlayer, it is imperative for any composition to be thermally set upon heating. International Patent Application WO 2013/080929 discloses thermal-setting underlayer compositions having a material of the formula:

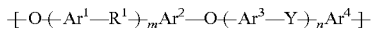

where $Ar^1$, $Ar^2$, $Ar^3$ and $Ar^4$ each represent a divalent aromatic group, $R^1$ represents a single bond or a $C_{1-20}$ divalent hydrocarbon; Y represents a carbonyl or sulfonyl group; m is 0 or 1; and n is 0 or 1. A relatively low molecular weight crosslinking additive is used in these compositions in order to provide the desired underlayer properties. However, such relatively low molecular weight crosslinking additives are prone to undesired out-gassing or sublimation during the curing process.

Polyarylene polymers are well-known as dielectric materials and possess many desirable properties. For example, International Pat. App. No. WO 97/10193 discloses certain polyarylene oligomers prepared from certain ethynyl-substituted aromatic compounds and a biscyclopentadienone monomer. Polyarylene oligomers are prepared at relatively high temperatures in organic solvents having relatively high boiling points (typically ≥150° C.). However, such reaction solvents are poor choices as casting solvents in the electronics industry, and the polyarylene oligomers must be precipitated from the reaction solvent and taken up in a different organic solvent with a much lower boiling point that is suitable for casting films of these polymers. Such polyarylene oligomers suffer from limited solubility in organic solvents conventionally used in the electronics industry, limiting the use of these polymers. U.S. patent application Ser. No. 15/056,352 (Gilmore et al.), filed on Feb. 29, 2016, discloses certain polyarylene oligomers having improved solubility for use as dielectric materials.

The semiconductor industry is still searching for compositions suitable for forming underlayers that meet industry requirements and that do not have components that out-gas or sublime during subsequent heating steps.

The present invention provides a process of forming a patterned layer comprising: (a) coating on a substrate a layer of a composition comprising (i) a polyarylene resin comprising as polymerized units: one or more first monomers of formula (1)

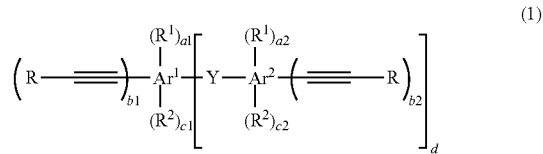

wherein each $Ar^1$ and $Ar^2$ is independently a $C_{6-30}$ aryl moiety; each R is independently chosen from H, $C_{6-30}$ aryl, and substituted $C_{6-30}$ aryl; each $R^1$ is independently chosen from —OH, $C_{1-6}$-hydroxyalkyl, $C(\!=\!O)OR^3$, —$C(\!=\!O)N(R^4)_2$, —O—$C(\!=\!O)R^5$, —$NR^4C(\!=\!O)R^6$, —$N(R^4)_3^+$ An$^-$, —$NO_2$; $S(\!=\!O)_2$—$OR^2$, —O—$S(\!=\!O)_2$—$R^8$, —$NR^4$—S$(\!=\!O)_2$—$R^6$, and $S(\!=\!O)_2$—$N(R^4)_2$; each $R^2$ is independently chosen from $C_{1-10}$-alkyl, $C_{1-10}$-haloalkyl, $C_{1-10}$-hydroxyalkyl, $C_{1-10}$-alkoxy, CN, —$N(R^4)_2$, and halo $R^3$=H, $C_{1-10}$-alkyl, $C_{1-10}$-hydroxyalkyl, $C_{1-10}$-aminoalkyl, $C_{6-30}$-aryl, or M; each $R^4$ is independently H, $C_{6-30}$-aryl or $C_{1-10}$-alkyl; each $R^5$ is independently chosen from H, $C_{1-10}$-alkyl, $C_{1-10}$-hydroxyalkyl, $C_{6-30}$-aryl, —O($C_{1-10}$-alkyl), —O($C_{6-10}$-aryl) and $N(R^4)_2$; $R^6$=H, $C_{1-10}$-alkyl, $C_{1-10}$-hydroxyalkyl, $C_{6-30}$-aryl, —O($C_{1-10}$-alkyl), or NH($C_{1-10}$-alkyl); $R^2$=H, $C_{1-10}$-alkyl, $C_{6-30}$-aryl, or M; $R^8$=$C_{6-30}$-aryl, $C_{1-10}$-alkyl, and halo-$C_{1-10}$-alkyl; M=an alkali metal ion, an alkaline earth metal ion, or an ammonium ion; An$^-$ is an anion chosen from halide and $C_{1-20}$-carboxylate; each Y is independently a single chemical bond or a divalent linking group chosen from —O—, —S—, —S(=O)—, —S(=O)$_2$—, —C(=O)—, —$(C(R^9)_2)_z$—, $C_{6-30}$-aryl, and $(C(R^9)_2)_{z1}$—$(C_{6-30}$-aryl)-$(C(R^9)_2)_{z2}$—; each $R^9$ is independently chosen from H, hydroxy, halo, $C_{1-10}$-alkyl, $C_{1-10}$-haloalkyl, and $C_{6-30}$-aryl; a1=0 to 3; a2=0 to 3; b1=1 to 4; b2=0 to 2; c1=0 to 2; c2=0 to 2; a1+a2=1 to 6; b1+b2=2 to 6; c1+c2=0 to 6; d=0 to 2; z=1 to 10; z1=0 to 10; z2=0 to 10; and z1+z2=1 to 10; and one or more second monomers comprising two or more cyclopentadienone moieties; and (ii) one or more organic solvents; (b) removing organic solvent to form an aromatic resin layer; (c) coating a layer of a photoresist on the aromatic resin layer; (d) exposing the photoresist layer to actinic radiation through a mask; (e) developing the exposed photoresist layer to form a resist pattern; and (f) transferring the pattern to the aromatic resin layer to expose portions of the substrate.

Also provided by the present invention is a process for filling a gap (or aperture), comprising: (a) providing a semiconductor substrate having a relief image on a surface of the substrate, the relief image comprising a plurality of gaps to be filled; (b) applying a gap-fill composition over the relief image, wherein the gap-fill composition comprises: (i) a polyarylene resin comprising as polymerized units: one or more first monomers of formula (1) and one or more second monomers comprising two or more cyclopentadienone moieties;

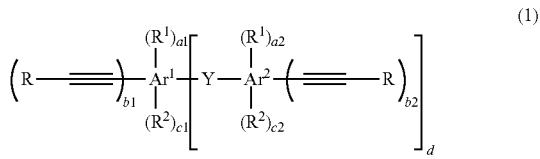

(1)

wherein each $Ar^1$ and $Ar^2$ is independently a $C_{6-30}$-aryl moiety; each R is independently chosen from H, $C_{6-30}$-aryl, and substituted $C_{6-30}$-aryl; each $R^1$ is independently chosen from —OH, $C_{1-6}$-hydroxyalkyl, —C(=O)$OR^3$, —C(=O)N$(R^4)_2$, —O—C(=O)$R^5$, —$NR^4$C(=O)$R^6$, —N$(R^4)_3^+$ An$^-$, —$NO_2$; S(=O)$_2$—$OR^7$, —O—S(=O)$_2$—$R^8$, —$NR^4$—S(=O)$_2$—$R^6$, and S(=O)$_2$—N$(R^4)_2$; each $R^2$ is independently chosen from $C_{1-10}$-alkyl, $C_{1-10}$-haloalkyl, $C_{1-10}$-hydroxyalkyl, $C_{1-10}$-alkoxy, CN, —N$(R^4)_2$, and halo $R^3$=H, $C_{1-10}$-alkyl, $C_{1-10}$-hydroxyalkyl, $C_{1-10}$-aminoalkyl, $C_{6-30}$-aryl, or M; each $R^4$ is independently H, $C_{6-30}$-aryl or $C_{1-10}$-alkyl; each $R^5$ is independently chosen from H, $C_{1-10}$-alkyl, $C_{1-10}$-hydroxyalkyl, $C_{6-30}$-aryl, —O($C_{1-10}$-alkyl), —O($C_{6-10}$-aryl) and N$(R^4)_2$; $R^6$=H, $C_{1-10}$-alkyl, $C_{1-10}$-hydroxy alkyl, $C_{6-30}$-aryl, —O($C_{1-10}$-alkyl), or NH($C_{1-10}$-alkyl); $R^7$=H, $C_{1-10}$-alkyl, $C_{6-30}$-aryl, or M; $R^8$=$C_{6-30}$-aryl, $C_{1-10}$-alkyl, and halo-$C_{1-10}$-alkyl; M=an alkali metal ion, an alkaline earth metal ion, or an ammonium ion; An$^-$ is an anion chosen from halide and $C_{1-20}$-carboxylate; each Y is independently a single chemical bond or a divalent linking group chosen from —O—, —S—, —S(=O)—, —S(=O)$_2$—, —C(=O)—, —(C$(R^9)_2)_z$—, $C_{6-30}$-aryl, and —(C$(R^9)_2)_{z1}$—($C_{6-30}$-aryl)-(C$(R^9)_2)_{z2}$—; each $R^9$ is independently chosen from H, hydroxy, halo, $C_{1-10}$-alkyl, $C_{1-10}$-haloalkyl, and $C_{6-30}$-aryl; a1=0 to 3; a2=0 to 3; b1=1 to 4; b2=0 to 2; c1=0 to 2; c2=0 to 2; a1+a2=1 to 6; b1+b2=2 to 6; c1+c2=0 to 6; d=0 to 2; z=1 to 10; z1=0 to 10; z2=0 to 10; and z1+z2=1 to 10; and (ii) one or more organic solvents; and (c) heating the gap-fill composition at a temperature to cure the polyarylene resin.

Figures 1A, 1B:
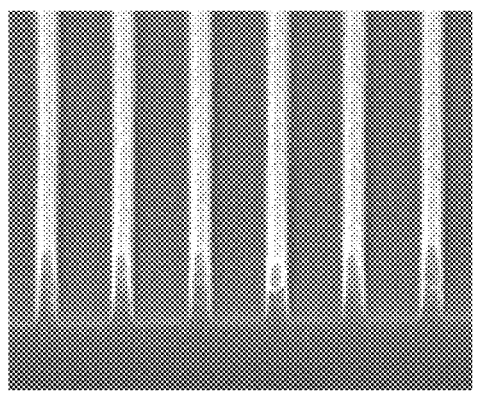
FIGS. 1A and 1B are scanning electron micrographs showing pattern transfer using films formed from the resins of the invention.

It will be understood that when an element is referred to as being "on" another element, it can be directly adjacent to the other element or intervening elements may be present therebetween. In contrast, when an element is referred to as being "directly on" another element, there are no intervening elements present. As used herein, the term "and/or" includes any and all combinations of one or more of the associated listed items.

It will also be understood that although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used throughout this specification, the following abbreviations shall have the following meanings, unless the context clearly indicates otherwise: ° C.=degree Celsius; g=gram; mg=milligram; L=liter; mL=milliliter; Å=angstrom; nm=nanometer; μm=micron=micrometer; mm=millimeter; sec.=second; min.=minute; hr.=hour; DI=deionized; and Da=dalton. "Wt %" refers to percent by weight, based on the total weight of a referenced composition, unless otherwise specified. Unless otherwise specified, all amounts are wt % and all ratios are molar ratios. All numerical ranges are inclusive and combinable in any order, except where it is clear that such numerical ranges are constrained to add up to 100%. The articles "a", "an" and "the" refer to the singular and the plural. "Alkyl" refers to linear, branched and cyclic alkyl unless otherwise specified. "Alkyl" refers to an alkane radical, and includes alkane monoradicals, diradicals (alkylene), and higher-radicals. "Halo" refers to fluoro, chloro, bromo, and iodo. Unless otherwise noted, "alkyl" includes "heteroalkyl". The term "heteroalkyl" refers to an alkyl group with one or more heteroatoms, such as nitrogen, oxygen, sulfur, phosphorus, replacing one or more carbon atoms within the radical, for example, as in an ether or a thioether. In one preferred embodiment, "alkyl" does not include "heteroalkyl". If no number of carbons is indicated for any alkyl or heteroalkyl, then 1-12 carbons are contemplated.

"Aryl" includes aromatic carbocycles and aromatic heterocycles. The term "aryl" refers to an aromatic radical, and includes monoradicals, diradicals (arylene), and higher-radicals. It is preferred that aryl moieties are aromatic carbocycles. "Substituted aryl" refers to any aryl moiety having one or more of its hydrogens replaced with one or more substituents chosen from halogen, $C_{1-6}$-alkyl, halo-$C_{1-6}$-alkyl, $C_{1-6}$-alkoxy, halo-$C_{1-6}$-alkoxy, phenyl, and phenoxy, preferably from halogen, $C_{1-6}$-alkyl, halo-$C_{1-4}$-alkyl, $C_{1-6}$-alkoxy, halo-$C_{1-4}$-alkoxy, and phenyl, and more preferably from halogen, $C_{1-6}$-alkyl, $C_{1-6}$-alkoxy, phenyl, and phenoxy. Preferably, a substituted aryl has from 1 to 3 substituents, and more preferably 1 or 2 substituents. As used herein, the term "polymer" includes oligomers. The term "oligomer" refers to dimers, trimers, tetramers and other polymeric materials that are capable of further curing. By the term "curing" is meant any process, such as polymerization or condensation, that increases the overall molecular weight of the present resins, removes solubility enhancing groups from the present oligomers, or both increases the overall molecular weight and removes solubility enhancing groups. "Curable" refers to any material capable of being cured under certain conditions. As used herein, "gap" refers to any aperture on a semiconductor substrate that is intended to be filled with a polymer composition.

The coating compositions useful in the present invention comprise one or more polyarylene resins and one or more organic solvents. Polyarylene resins useful in the present invention comprise as polymerized units one or more first monomers having two or more alkynyl moieties and at least one polar moiety, and one or more second monomers having two or more cyclopentadienone moieties. As used herein, the terms "polyarylenes" and "polyarylene resins" are used interchangeably and refer to polymers having di- or higher-valent aryl moieties in the polymer backbone and are prepared by a Diels-Alder polymerization of a polyalkynyl-substituted first monomer and a second monomer comprising 2 or more cyclopentadienone moieties. Such polyarylenes may optionally contain one or more divalent linking groups in the polymer backbone.

Suitable first monomers having two or more alkynyl moieties are those having the structure of formula (1)

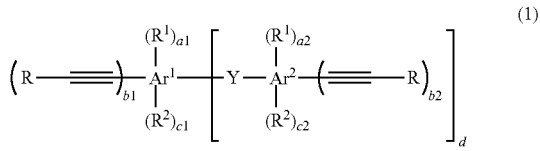

wherein $Ar^1$ and each $Ar^2$ are independently a $C_{6-30}$-aryl moiety; each R is independently chosen from H, $C_{6-30}$-aryl, and substituted $C_{6-30}$-aryl; each $R^1$ is independently chosen from —OH, $C_{1-6}$-hydroxyalkyl, —C(=O)$OR^3$, —C(=O)N$(R^4)_2$, —O—C(=O)$R^5$, —$NR^4$C(=O)$R^6$, —N$(R^4)_3^+$$An^-$, —$NO_2$; S(=O)$_2$—$OR^7$, —O—S(=O)$_2$—$R^8$, —$NR^4$—S(=O)$_2$—$R^6$, and S(=O)$_2$—N$(R^4)_2$; each $R^2$ is independently chosen from $C_{1-10}$-alkyl, $C_{1-10}$-haloalkyl, $C_{1-10}$-hydroxyalkyl, $C_{1-10}$-alkoxy, CN, —N$(R^4)_2$, and halo $R^3$=H, $C_{1-10}$-alkyl, $C_{1-10}$-hydroxyalkyl, $C_{1-10}$-aminoalkyl, $C_{6-30}$-aryl, or M; each $R^4$ is independently H, $C_{6-30}$-aryl or $C_{1-10}$-alkyl; each $R^5$ is independently chosen from H, $C_{1-10}$-alkyl, $C_{1-10}$-hydroxyalkyl, $C_{6-30}$-aryl, —O($C_{1-10}$-alkyl), —O($C_{6-10}$-aryl) and N$(R^4)_2$; $R^6$=H, $C_{1-10}$-alkyl, $C_{1-10}$-hydroxy alkyl, $C_{6-30}$-aryl, —O($C_{1-10}$-alkyl), or NH($C_{1-10}$-alkyl); $R^7$=H, $C_{1-10}$-alkyl, $C_{6-30}$-aryl, or M; $R^8$=$C_{6-30}$-aryl, $C_{1-10}$-alkyl, and halo-$C_{1-10}$-alkyl; M=an alkali metal ion, an alkaline earth metal ion, or an ammonium ion; $An^-$ is an anion chosen from halide and $C_{1-20}$-carboxylate; each Y is independently a single chemical bond or a divalent linking group chosen from —O—, —S—, —S(=O)—, —S(=O)$_2$—, —C(=O)—, —(C($R^9$)$_2$)$_z$—, $C_{6-30}$ aryl, and —(C($R^9$)$_2$)$_{z1}$—($C_{6-30}$-aryl)-(C($R^9$)$_2$)$_{z2}$—; each $R^9$ is independently chosen from H, hydroxy, halo, $C_{1-10}$-alkyl, $C_{1-10}$-haloalkyl, and $C_{6-30}$-aryl; a1=0 to 3; a2=0 to 3; b1=1 to 4; b2=0 to 2; c1=0 to 2; c2=0 to 2; a1+a2=1 to 6; b1+b2=2 to 6; c1+c2=0 to 6; d=0 to 2; z=1 to 10; z1=0 to 10; z2=0 to 10; and z1+z2=1 to 10. Each R is preferably independently chosen from H and $C_{6-20}$-aryl, more preferably from H and $C_{6-10}$-aryl, and yet more preferably from H and phenyl. It is preferred that each $R^1$ is independently chosen from —OH, $C_{1-4}$-hydroxyalkyl, —C(=O)$OR^3$, —C(=O)N$(R^4)_2$, —O—C(=O)$R^5$, —S(=O)$_2$—$OR^6$, and S(=O)$_2$—N$(R^4)_2$', more preferably from —OH, $C_{1-4}$-hydroxyalkyl, —C(=O)$OR^3$ and —C(=O)N$(R^4)_2$, and yet more preferably —OH and —C(=O)$OR^3$. It is preferred that each $R^2$ is independently chosen from $C_{1-10}$-alkyl, $C_{1-10}$-haloalkyl, $C_{1-10}$-hydroxyalkyl, $C_{1-10}$-alkoxy, N$(R^4)_2$, and halo, and more preferably from $C_{1-10}$-alkyl, $C_{1-10}$-haloalkyl, and halo. Preferably, $R^3$ is H, $C_{1-6}$-alkyl, $C_{1-6}$-hydroxyalkyl, $C_{1-6}$-aminoalkyl, $C_{6-30}$-aryl, or M, more preferably H, $C_{1-4}$-alkyl, $C_{1-6}$-hydroxyalkyl, or M, and even more preferably H or M. $R^4$ is preferably H, $C_{6-30}$-aryl, or $C_{1-6}$-alkyl, and more preferably H or $C_{1-4}$-alkyl. It is preferred that $R^5$ is $C_{1-6}$-alkyl, $C_{1-6}$-hydroxyalkyl, $C_{6-30}$-aryl, —O($C_{1-10}$-alkyl), or —N$(R^4)_2$, and more preferably $C_{1-6}$-alkyl, $C_{1-6}$-hydroxyalkyl, $C_{6-20}$-aryl, —O($C_{1-6}$-alkyl), or —N$(R^4)_2$. $R^6$ is preferably H, $C_{1-10}$-alkyl, $C_{1-6}$-hydroxyalkyl, $C_{6-20}$-aryl, —O($C_{1-10}$-alkyl), or —N$(R^4)_2$, and more preferably H, $C_{1-6}$-alkyl, —O($C_{1-6}$-alkyl), or —N$(R^4)_2$. $R^7$ is preferably H, $C_{1-6}$-alkyl, $C_{6-20}$-aryl, or M, more preferably H, $C_{1-4}$-alkyl, or M, and even more preferably H or M. Preferably, each Y is independently a single chemical bond or a divalent linking group chosen from —O—, —S—, —S(=O)—, —S(=O)$_2$—, —C(=O)—, —(C($R^9$)$_2$)$_z$—, and $C_{6-30}$-aryl, and more preferably a chemical bond, —O—, —S—, —S(=O)$_2$—, —C(=O)—, and —(C($R^9$)$_2$)$_z$—. It is preferred that $R^8$ is $C_{6-20}$-aryl, $C_{1-10}$-alkyl, and $C_{1-10}$-fluoroalkyl, and more preferably phenyl, tolyl, methyl, and trifluoromethyl. $R^9$ is preferably H, halo, $C_{1-10}$-alkyl, $C_{1-10}$ haloalkyl, and $C_{6-30}$-aryl, and more preferably fluoro, $C_{1-6}$-alkyl, $C_{1-6}$-fluoroalkyl, and $C_{6-20}$-aryl. Preferred alkaline earth ions for M are magnesium ions or calcium ions. Preferred alkali metal ions for M are lithium ions, sodium ions, and potassium ions. M is preferably chosen from alkali metal ions, magnesium ions, calcium ions, and ammonium ions, even more preferably from lithium ions, sodium ions, potassium ions, magnesium ions, calcium ions, and ammonium ions, and yet more preferably from lithium ions, sodium ions, potassium ions, and ammonium ions. Any suitable ammonium ion may be used for M, such as those of the formula [$NA_4$]$^+$ wherein each A is independently chosen from H, $C_{1-6}$-alkyl, $C_{7-10}$-aralkyl and $C_{6-8}$-aryl. Exemplary ammonium ions include, without limitation, ammonium, tetramethylammonium, tetraethylammonium, tetrabenzylammonium, and tetraphenylammonium. $An^-$ is preferably chosen from halide and $C_{1-10}$-carboxylate, and more preferably halide and $C_{1-6}$-carboxylate. Preferably, a1=1 to 3, more preferably 1 to 2, and most preferably a1=1. It is preferred that a2=0 to 2. Preferably, a1+a2=1 to 4, more preferably 1 to 3, and yet more preferably 1 to 2. It is preferred that b1=1 to 2, and more preferably 2. It is preferred that b2=0 or 1. Preferably, b1+b2=2 to 4, and more preferably 2 or 3, and even more preferably 2. Preferably c1=0 or 1, and more preferably 0. It is preferred that c2 is 0 or 1, and more preferably 0. Preferably, c1+c2 is preferably 0 to 3, more preferably 0 to 2, and even more preferably 0. It is preferred that d=0 or 1, and more preferably 0. Preferably, z=1 to 6, more preferably 1 to 3, and even more preferably z=1. Preferably, z1 and z2 are each 0 to 5. Preferably, z1+z2=1 to 6, and more preferably 2 to 6.

Suitable aryl moieties for $Ar^1$ and $Ar^2$ include, but are not limited to, pyridyl, phenyl, naphthyl, anthracenyl, phenanthryl, tetracenyl, pyrenyl, perylenyl, coronenyl, pentacenyl, triphenylenyl, tetraphenyl, benzotetracenyl, biphenyl, and binaphthyl. It is preferred that $Ar^1$ and $Ar^2$ in formula (1) are independently a $C_{6-20}$-aryl moiety. Preferred aryl moieties for $Ar^1$ and $Ar^2$ are phenyl, naphthyl, anthracenyl, phenanthryl, pyrenyl, tetracenyl, pentacenyl, tetraphenyl, triphenylenyl, and perylenyl.

Preferred first monomers are those of formulas (2) and (3):

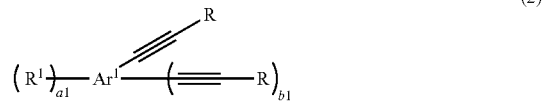

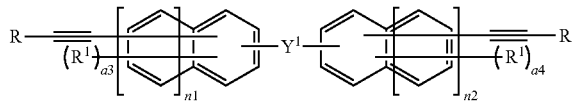
(3)

wherein $Ar^1$, R, $R^1$, a1 and b1 are as defined above; a3 is 1 or 2; a4 is 0 to 2; each of n1 and n2 is independently 0 to 4; and $Y^1$ is a single chemical bond, O, S, $S(=O)_2$, $C(=O)$, $C(CH_3)_2$, $CF_2$, and $C(CF_3)_2$. It will be appreciated by those skilled in the art that the brackets ("[ ]") in formula (3) refer to the number of aromatic rings fused to the phenyl ring. Accordingly, when n1 (or n2)=0, the aromatic moiety is phenyl; when n1 (or n2)=1, the aromatic moiety is naphthyl; when n1 (or n2)=2, the aromatic moiety may be anthracenyl or phenanthryl; when n1 (or n2)=3, the aromatic moiety may be tetracenyl, tetraphenyl, triphenylenyl, or pyrenyl; and when n1 (or n2)=4, the aromatic moiety may be perylenyl or benzotetracenyl. In formula (2), a1 is preferably 1 to 2, and more preferably a1=1. It is preferred that b1 in formula (2) is 1 or 2, and more preferably 1. R is preferably H or phenyl. $R^1$ in each of formulas (2) and (3) is preferably —OH, $C_{1-6}$-hydroxyalkyl, —C(=O)OR$^3$, —C(=O)N(R$^4$)$_2$, —O—C(=O)R$^5$, —S(=O)$_2$—OR$^6$, and S(=O)$_2$—N(R$^4$)$_2$, more preferably from —OH, $C_{1-4}$-hydroxyalkyl, —C(=O)OR$^3$ and —C(=O)N(R$^4$)$_2$, and yet more preferably —OH and —C(=O)OR$^3$. $Ar^1$ in formula (2) is preferably phenyl, naphthyl, anthracenyl, pyrenyl, and perylenyl. In formula (3), it is preferred that n1 and n2 are independently chosen from 0, 1, 2, 3, and 4, more preferably from 0, 1, 2 and 3, and even more preferably from 1,2 and 3. It is further preferred that n1=n2. In formula (3), $Y^1$ is preferably a single chemical bond, O, $S(=O)_2$, $C(=O)$, $C(CH_3)_2$, $CF_2$, and $C(CF_3)_2$, and more preferably a chemical bond.

Particularly preferred first monomers of formula (2) are monomers of formulas (4) to (8):

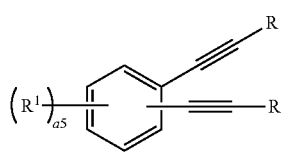
(4)

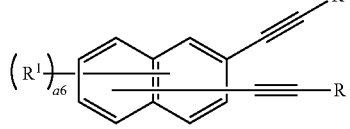
(5)

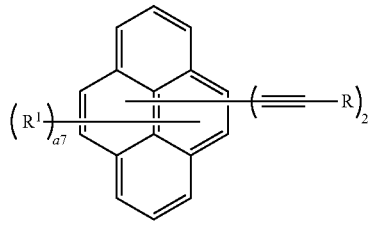
(6)

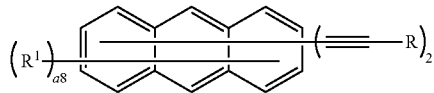
(7)

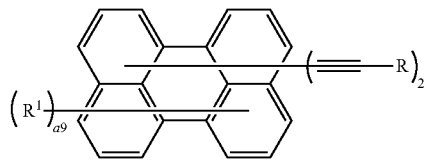
(8)

wherein R and $R^1$ are as described above; a5=1 or 2; and each of a6, a7, a8 and a9 are independently 1 to 4. Preferably, a5=1. It is preferred that a6 is 1 to 3, more preferably 1 or 2, and even more preferably 1. Preferably, each of a7 to a9 is independently 1 to 3, and more preferably 1 to 2.

In the first monomers of formula (1), any two alkynyl moieties may have an ortho, meta or para relationship to each other, and preferably a meta or para relationship to each other. Preferably, the alkynyl moieties in the monomers of formula (1) do not have an ortho relationship to each other. Suitable monomers of formula (1) are generally commercially available or may be readily prepared by methods known in the art.

The present polyarylene resins may be comprised of one monomer of formula (1), or a mixture of two or more monomers of formula (1). Monomers of formula (2) are preferred first monomers. It is preferred that the present polymers are comprised of polymerized units of one or more monomers of formula (2). In an alternate preferred embodiment, the present resins are comprised of polymerized units of one or more monomers of formula (3), or in yet another alternate embodiment of one or more monomers of formula (2) and one or more monomers of formula (3). Mixtures of resins comprising as polymerized units one or more monomers of formula (1) may suitably be used.

Any monomer containing two or more cyclopentadienone moieties may suitably be used as the second monomer to prepare the present resins. Alternatively, a mixture of 2 or more different monomers, each having two or more cyclopentadienone moieties, may be used as the second monomer. Such monomers containing two cyclopentadienone moieties are well-known in the art, such as those described in U.S. Pat. Nos. 5,965,679; 6,288,188; and 6,646,081; and in Int. Pat. Pubs. WO 97/10193 and WO 2004/073824. Preferably, the second monomers comprises 2 to 4 cyclopentadienone moieties, more preferably 2 or 3 cyclopentadienone moieties, and most preferably two cyclopentadienone moieties. It is preferred that the second monomer has the structure shown in formula (9)

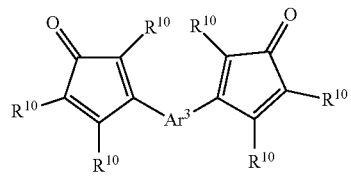
(9)

wherein each $R^{10}$ is independently chosen from H, $C_{1-6}$-alkyl, or optionally substituted $C_{5-30}$-aryl; and $Ar^3$ is an aromatic moiety having from 5 to 60 carbon atoms. Preferably, each $R^{10}$ is independently chosen from $C_{3-6}$ alkyl, phenyl and substituted phenyl, and more preferably each $R^{10}$ is phenyl. A wide variety of aromatic moieties are suitable for use as $Ar^3$, such as those disclosed in U.S. Pat. No.

5,965,679. Exemplary aromatic moieties useful for $Ar^3$ include those having the structure shown in formula (10)

 (10)

wherein x is an integer chosen from 1, 2 or 3; y is an integer chosen from 0, 1, or 2; each $Ar^4$ is independently chosen from

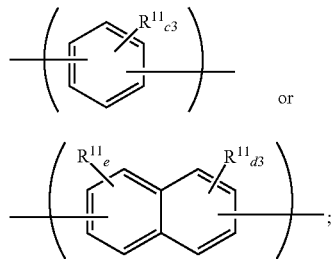

each $R^{11}$ is independently chosen from halogen, $C_{1-6}$-alkyl, $C_{1-6}$-haloalkyl, $C_{1-6}$-alkoxy, $C_{1,6}$-haloalkoxy, phenyl, and phenoxy; c3 is an integer from 0 to 4; each of d3 and e is independently an integer from 0 to 3; each Z is independently chosen from a chemical bond, O, S, $NR^{12}$, $PR^{12}$, $P(=O)R^{12}$, $C(=O)$, $CR^{13}R^{14}$, and $SiR^{13}R^{14}$; $R^{12}$, $R^{13}$, and $R^{14}$ are independently chosen from H, $C_{1-4}$-alkyl, halo-$C_{1-4}$-alkyl, and phenyl. It is preferred that x is 1 or 2, and more preferably 1. It is preferred that y is 0 or 1, and more preferably 1. Preferably, each $R^{11}$ is independently chosen from halogen, $C_{1-4}$-alkyl, halo-$C_{1-4}$-alkyl, $C_{1-4}$-alkoxy, halo-$C_{1-4}$-alkoxy, and phenyl, and more preferably from fluoro, $C_{1-4}$-alkyl, fluoro-$C_{1-4}$-alkyl, $C_{1-4}$-alkoxy, fluoro-$C_{1-4}$-alkoxy, and phenyl. It is preferred that c3 is from 0 to 3, more preferably from 0 to 2, and yet more preferably 0 or 1. It is preferred that each of d3 and e is independently 0 to 2, and more preferably 0 or 1. In formula (12), it is preferred that d3+e=0 to 4, and more preferably 0 to 2. Each Z is preferably independently chosen from O, S, $NR^{12}$, $C(=O)$, $CR^{13}R^{14}$, and $SiR^{13}R^{14}$, more preferably from O, S, $C(=O)$, and $CR^{13}R^{14}$, and yet more preferably from O, $C(=O)$, and $CR^{13}R^{14}$. It is preferred that each $R^{12}$, $R^{13}$, and $R^{14}$ are independently chosen from H, $C_{1-4}$-alkyl, fluoro-$C_{1-4}$-alkyl, and phenyl; and more preferably from H, $C_{1-4}$-alkyl, fluoro-$C_{1-2}$-alkyl, and phenyl. Preferably, each $Ar^4$ has the formula (11).

One or more optional third monomers which may be used to form the present resins are those of formula (13)

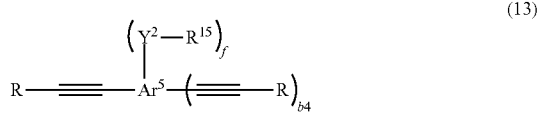 (13)

wherein each R is as defined above for the monomers of formula (1); $Ar^5$ is a $C_{6-30}$-aromatic moiety; each $Y^2$ is independently a single chemical bond or a divalent linking group chosen from —O—, —S—, —S(=O)—, —S(=O)$_2$—, —C(=O)—, —$(C(R^9)_2)_z$—, $C_{6-30}$-aryl, and —$(C(R^9)_2)_{z1}$—$(C_{6-30}$-aryl$)$-$(C(R^9)_2)_{z2}$—; each $R^{15}$ is independently chosen from $C_{1-4}$-alkyl, $C_{1-4}$-haloalkyl, $C_{1-4}$-alkoxy, optionally substituted $C_{7-14}$-aralkyl, and optionally substituted $C_{6-10}$-aryl; b4=1 or 2; and f=0 to 4; z is 1 to 10; z1 is 0 to 10; z2 is 0 to 10; and z1+z2=1 to 10. "Substituted aralkyl" refers to an aralkyl moiety having one or more of its hydrogens replaced with one or more substituents chosen from halogen, $C_{1-6}$-alkyl, $C_{1-6}$-haloalkyl, $C_{1-6}$-alkoxy, $C_{1-6}$-haloalkoxy, phenyl, and phenoxy, preferably from halogen, $C_{1-6}$-alkyl, $C_{1-4}$-haloalkyl, $C_{1-6}$-alkoxy, $C_{1-4}$-haloalkoxy, and phenyl, and more preferably from halogen, $C_{1-6}$-alkyl, $C_{1-6}$-alkoxy, phenyl, and phenoxy. Fluorine is the preferred halogen. In formula (13), it is preferred that each R is independently H or $C_{6-10}$-aryl, and more preferably H or phenyl. It is preferred that each $R^{15}$ is independently chosen from $C_{1-4}$-alkyl, $C_{1-4}$-fluoroalkyl, $C_{1-4}$-alkoxy, benzyl, phenethyl, phenyl, naphthyl, substituted phenyl and substituted naphthyl, more preferably $C_{1-2}$-alkyl, $C_{1-4}$-fluoroalkyl, $C_{1-2}$-alkoxy, phenyl, and substituted phenyl, and yet more preferably from $C_{1-2}$-alkyl, $C_{1-4}$-fluoroalkyl, $C_{1-2}$-alkoxy, and phenyl. Preferably, b4=2. Preferably, f=0 to 3, more preferably 0 to 2, and yet more preferably f=0. $Ar^5$ may be any suitable $C_{6-30}$ aromatic moiety, such as, without limitation, phenyl, naphthyl, anthracenyl, phenanthryl, tetracenyl, pyrenyl, perylenyl, coronenyl, pentacenyl, triphenylenyl, tetraphenyl, benzotetracenyl, biphenyl, binaphthyl, diphenyl ether, and dinaphthyl ether. Preferably, optional monomers of formula (13) comprise 2 or 3 alkynyl moieties having a terminal hydrogen or terminal phenyl moiety. Any 2 alkynyl moieties in the monomers of formula (13) may have an ortho, meta or para relationship to each other, and preferably a meta or para relationship to each other. Preferably, the alkynyl moieties do not have an ortho relationship to each other. A single optional monomer of formula (13) may be used to prepare the present polymers, or two or more optional monomers of formula (13) but different from each other may be used. When a single optional monomer of formula (13) is used, it is preferred that b4=2. In one preferred embodiment, the present polymers further comprise as polymerized units a monomer of formula (13), and more preferably a monomer of formula (13) wherein b4=2. In an alternate preferred embodiment, the present polymers further comprise as polymerized units one monomer of formula (13) wherein b4=1, and another monomer of formula (13) wherein b4=2.

Compounds useful as the third monomers of formula (13) are generally commercially available, or may be prepared by methods known in the art. Preferred optional monomers of formula (13) are: 1,3-diethynylbenzene; 1,4-diethynylbenzene; 4,4'-diethynyl-1,1'-biphenyl; 3,5-diethynyl-1,1'-biphenyl; 1,3,5-triethynylbenzene; 1,3-diethynyl-5-(phenylethynyl)benzene; 1,3-bis(phenylethynyl)benzene; 1,4-bis(phenylethynyl)benzene; 1,3,5-tris(phenylethynyl)benzene; 4,4'-bis(phenylethynyl)-1,1'-biphenyl; 4,4'-diethynyl-diphenylether; and mixtures thereof. More preferably, the monomers of formula (13) are chosen from: 1,3-diethynylbenzene; 1,4-diethynylbenzene; 1,3,5-triethynylbenzene; 4,4'-diethynyl-1,1'-biphenyl; 1,3-bis(phenylethynyl)-benzene; 1,4-bis(phenylethynyl)benzene; 4,4'-bis(phenylethynyl)-1,1'-biphenyl; 1,3,5-tris(phenylethynyl)benzene; and mixtures thereof. Even more preferably, the optional third monomers are chosen from: 1,3-diethynylbenzene; 1,4-diethynylbenzene; 4,4'-diethynyl-1,1'-biphenyl; 1,3,5-triethynylbenzene; 1,3,5-tris(phenylethynyl)benzene; and mixtures thereof.

Optionally, one or more end capping monomers may be used to prepare the present polyarylene resins. Such end capping monomers have a single alkyne moiety and a solubility improving polar group and which function to cap one end, preferably two ends, and more preferably all ends, of the present polymers. Suitable end capping monomers are those disclosed in U.S. Pub. Pat. App. No. 2016/0060393 (Gilmore et al.). It will be appreciated by those skilled in the art that reaction conditions can be selected such that these optional end capping monomers preferentially react with alkynyl moieties having terminal hydrogens (R=H) in the polymer over alkynyl moieties having terminal aryl moieties (R=$C_{6-20}$-aryl). Preferably, the polar moieties present in these optional end capping monomers are cleavable under conditions used to cure the present polyarylene polymers. Suitable optional end capping monomers are those of formula (14):

(14)

wherein $R^{16}$ is H, optionally substituted $C_{1-10}$-alkyl, optionally substituted $C_{7-12}$-aralkyl, optionally substituted $C_{6-10}$-aryl, or $R^{17}$; and $R^{17}$ is a polar moiety. Suitable polar moieties are any hydrocarbyl moiety having from 1 to 20 carbon atoms and one or more functional groups chosen from —C(=O)—$R^{18}$, —C(=O)O$R^{18}$, —OH, —$NO_2$, and —$NR^{18}R^{19}$, where $R^{18}$ and $R^{19}$ are independently chosen from H, $C_{1-10}$-alkyl, $C_{7-16}$-aralkyl, and $C_{6-10}$-aryl. Preferably, the polar moiety of formula (14) is chosen from —C(=O)—$R^{18}$, —C(=O)O$R^{18}$, —OH, and —$NR^{18}R^{19}$, and more preferably from —C(=O)—$R^{18}$, —C(=O)O$R^{18}$, and —OH. Such —C(=O)—, —OH, and —$NR^{18}R^{19}$ functional groups may be part of another functional group, as in carboxylic acids, anhydrides, amides, ketones, esters, and the like. It is preferred that the polar moiety is chosen from carboxyl, $C_{2-12}$-aliphatic carboxylate, hydroxy-$C_{1-10}$-alkyl, hydroxy-$C_{6-10}$-aryl, $C_{7-20}$-aryl carboxylic acid, $C_{8-20}$-aryl carboxylic acid anhydride, $C_{7-20}$-aryl carboxylates, $C_{7-20}$-aryl amide, $C_{8-20}$-aryl imide, amino-$C_{1-10}$-alkyl, and $C_{6-20}$-aryl amine. More preferably, the polar moiety of formula (14) is chosen from carboxyl, $C_{2-12}$-aliphatic carboxylate, hydroxy-$C_{1-10}$-alkyl, hydroxy-$C_{6-10}$-aryl, $C_{7-16}$-aryl carboxylic acid, and $C_{8-16}$-aryl carboxylic acid anhydride. Exemplary end capping monomers are: propiolic acid; acetylene dicarboxylic acid; phenyl propiolic acid; ethynyl benzoic acid; ethynyl phthalic acid; propargyl alcohol; propargylamine; 2-butyn-1,4-diol; 2-methyl-3-butyn-2-ol; 3-butyn-1-ol; 3-butyn-2-ol; 2-butyn-1-ol; 2-butynoic acid; ethynyl phenol; xylityl propiolate; ethynyl phthalic anhydride; ethynyl phthalimide; ethynyl benzamide; 2-butyn-1,4-diol diacetate; 3-butyn-2-one; 1-ethynyl-1-cyclohexanol; 1-ethynylcyclohexylamine; 1-ethynylcyclopentanol; ethynylaniline; N-(ethynylphenyl)acetamide; 2-carbamoyl-5-ethynylbenzoic acid; ethynyl-nitrobenzene; propiolamide; N-hydroxylpropiolamide; 2-aminobut-3-ynoic acid; and mixtures thereof. Preferred end capping monomers are: propiolic acid; acetylene dicarboxylic acid; phenyl propiolic acid; ethynyl benzoic acid; ethynyl phthalic acid; propargyl alcohol; 2-butyn-1,4-diol; 2-methyl-3-butyn-2-ol; 3-Butyn-1-ol; 3-butyn-2-ol; 2-Butyn-1-ol; 2-butynoic acid; ethynyl phenol; xylityl propiolate; ethynyl phthalic anhydride; 2-Butyn-1,4-diol diacetate; and mixtures thereof. Such end capping monomers are generally commercially available, or may be prepared by methods known in the art.

The resins of the present invention are prepared by reacting one or more first monomers of formula (1), one or more second monomers having two or more cyclopentadienone moieties, and optionally one or more additional monomers, such as the optional monomers of formulae (13) and/or (14) discussed above, in a suitable organic solvent. The mole ratio of the total first monomers (that is, monomers containing two or more alkyne moieties) to the total second monomers (that is, monomers containing two cyclopentadienone moieties) is from 1:1.2 to 1.95:1, preferably from 1:1.15 to 1.75:1, and more preferably from 1:1.1 to 1.2:1. When an optional third monomer is used, the mole ratio of the total first monomer to the total third monomer is from 0.1:1 to 1:0.1, preferably from 0.25:1 to 1:0.25, more preferably from 0.3:1 to 1:0.3, yet more preferably from 0.5:1 to 1:0.5, and even more preferably from 0.4:0.6 to 0.75:0.25. When an optional end capping monomer is used, it is typically used in a total amount of from 0.05 to 0.25 moles, based on 1 mole of the second monomer, preferably from 0.075 to 0.2 moles, and more preferably from 0.09 to 0.125 moles. Suitable organic solvents useful to prepare the present resins are benzyl esters of $C_{2-6}$-alkanecarboxylic acids, dibenzyl esters of $C_{2-6}$-alkanedicarboxylic acids, tetrahydrofurfuryl esters of $C_{2-6}$-alkanecarboxylic acids, ditetrahydrofurfuryl esters of $C_{2-6}$-alkanedicarboxylic acids, phenethyl esters of $C_{2-6}$-alkanecarboxylic acids, diphenethyl esters of $C_{2-6}$-alkanedicarboxylic acids, aromatic ethers, aromatic hydrocarbons, cyclic hydrocarbons, carbonates, and lactones. Preferred aromatic ethers are diphenyl ether, dibenzyl ether, $C_{1-6}$-alkoxy-substituted benzenes and benzyl $C_{1-6}$-alkyl ethers, and more preferably $C_{1-4}$-alkoxy-substituted benzenes and benzyl $C_{1-6}$-alkyl ethers. Preferred organic solvents are benzyl esters of $C_{2-6}$-alkanecarboxylic acids, dibenzyl esters of $C_{2-6}$-alkanedicarboxylic acids, tetrahydrofurfuryl esters of $C_{2-6}$-alkanecarboxylic acids, ditetrahydrofurfuryl esters of $C_{2-6}$-alkanedicarboxylic acids, phenethyl esters of $C_{2-6}$-alkanecarboxylic acids, diphenethyl esters of $C_{2-6}$-alkanedicarboxylic acids, $C_{1-6}$-alkoxy-substituted benzenes, and benzyl $C_{1-6}$-alkyl ethers, more preferably benzyl esters of $C_{2-6}$-alkanecarboxylic acids, tetrahydrofurfuryl esters of $C_{2-6}$-alkanecarboxylic acids, phenethyl esters of $C_{2-6}$-alkanecarboxylic acids, $C_{1-4}$-alkoxy-substituted benzenes, benzyl $C_{1-4}$-alkyl ethers, dibenzyl ether, carbonates, and lactones, and yet more preferably benzyl esters of $C_{2-6}$-alkanecarboxylic acids, tetrahydrofurfuryl esters of $C_{2-6}$-alkanecarboxylic acids, $C_{1-4}$-alkoxy-substituted benzenes, benzyl $C_{1-4}$-alkyl ethers, carbonates, and lactones. Exemplary organic solvents include, without limitation, benzyl acetate, benzyl propionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, xylene, mesitylene, cumene, limonene, benzyl methyl ether, benzyl ethyl ether, and propylene carbonate, and preferably benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, xylene, mesitylene, cumene, limonene, propylene carbonate, and gamma-butyrolactone.

The resins of the present invention may be prepared by combining one or more first monomers, one or more second monomers, optionally one or more third monomers, optionally one or more end capping monomers, and organic solvent, each as described above, in any order in a vessel, and heating the mixture. The second monomer may be combined with the organic solvent in a vessel, and then the first monomer and any optional additional monomers are added to the mixture. In one embodiment, the second monomer and organic solvent mixture is heated to the desired reaction temperature before the first monomer is added. The first monomer may be added over a period of time, such as from 0.25 to 46 hours, and preferably from 1 to 6 hours, to reduce exotherm formation, but is preferably added at one time. The second monomer and organic solvent mixture may be heated to the desired reaction temperature before the first monomer and any optional monomers are added. Alternatively, the second monomer, first monomer, optional third monomer, optional end capping monomer and solvent are added to a vessel, and then heated to the desired reaction temperature and held at this temperature for a period of time to provide the desired oligomer. The reaction mixture is heated at a suitable temperature, such as from 85 to 215° C., and preferably from 90 to 205° C. The first and second monomers may react at temperatures below those conventionally used to make polyarylene polymers by a Diels-Alder type reaction. While not wishing to be bound by theory, it is believed that the presence of certain solubility enhancing moieties may activate the monomer such that the Diels-Alder reaction is facilitated at a lower temperature. The reaction may be carried out under oxygen-containing atmosphere, but an inert atmosphere is preferred. Following the reaction, the resulting polymer may be isolated from the reaction mixture, diluted with appropriate solvent, or used as is for coating a surface. When a first monomer having two alkynyl moieties having terminal hydrogens and one alkynyl moiety having a terminal phenyl group is used to prepare the present polymers, heating the monomer reaction mixture at a temperature of 90 to 130° C. will provide an oligomer where substantially only the alkynyl moieties having terminal hydrogens react with the first monomer to form a linear oligomer having 1 or 2 third monomers as end caps, that is, the alkynyl moieties having the terminal phenyl group remain substantially unreacted (<10%, and preferably <5%, of such groups react).

The present polyarylene resins may have any suitable molecular weight range, such as a weight average molecular weight ($M_w$) of from 500 to 250000 Da (as determined by gel permeation chromatography against polystyrene standards), preferably from 1000 to 100000 Da, and more preferably from 3000 to 25000 Da. The choice of organic solvent can be used to tailor the $M_w$ of the resulting resin. For example, when aromatic ether solvents, such as $C_{1-6}$-alkoxy-substituted benzenes, are used, relatively higher $M_w$ oligomers may be obtained as compared to resins having a relatively lower $M_w$ when the same reaction is performed using a benzyl ester of a $C_{2-6}$-alkanecarboxylic acid as the organic solvent. The molecular weight of the present resins can also be controlled, even in aromatic ether solvents, by adjusting the amount of the first monomer and/or optional monomers. For example, to obtain a resin having a $M_w$ of ≤35000, >1.05 mole of the first monomer should be used for each 1 mole of the second monomer, that is, the mole ratio of total second monomers to total alkyne monomers (that is, total first monomers and any third monomers) should be 1: ≥1.05, such as from 1:1.075 to 1:1.95. As the optional end capping monomer, such as the monomers of formula (14), has a single alkynyl moiety, it can be used to control the growth of the polymer chain. Increasing the total amount of any end capping monomer in the reaction will generally provide resins having relatively lower weight average molecular weights ($M_w$), while decreasing the total amount of any end capping monomer will provide resins having relatively higher $M_w$.

While not intending to be bound by theory, it is believed that the present polyarylene resins are formed through the Diels-Alder reaction of the cyclopentadienone moieties of the second monomer with the alkynyl moieties of the first monomer and the alkynyl moieties of any optional third monomers and the alkynyl moieties of any optional end capping monomers upon heating. During such Diels-Alder reaction, a carbonyl-bridged species forms. It will be appreciated by those skilled in the art that such carbonyl-bridged species may be present in the resins. Upon further heating, the carbonyl bridging species will be essentially fully converted to an aromatic ring system. Due to the mole ratio of the monomers used, the present resins contain arylene rings in the polymer backbone which are substituted with at least one solubility enhancing moiety as illustrated in reaction scheme 1, where A is the first monomer and B is the second monomer. The present resins may be composed of polymer chains that terminate with cyclopentadienone and/or alkyne moieties, depending on the particular mole ratio of first monomers (and any optional third monomers) to second monomers. It will be appreciated by those skilled in the art that when end capping monomers are used, the present resins will be composed of polymer chains that generally do not terminate with cyclopentadienone moieties. Not wishing to be bound by theory, it is preferred that no unreacted cyclopentadienone moieties remain in the present resins.

Scheme 1

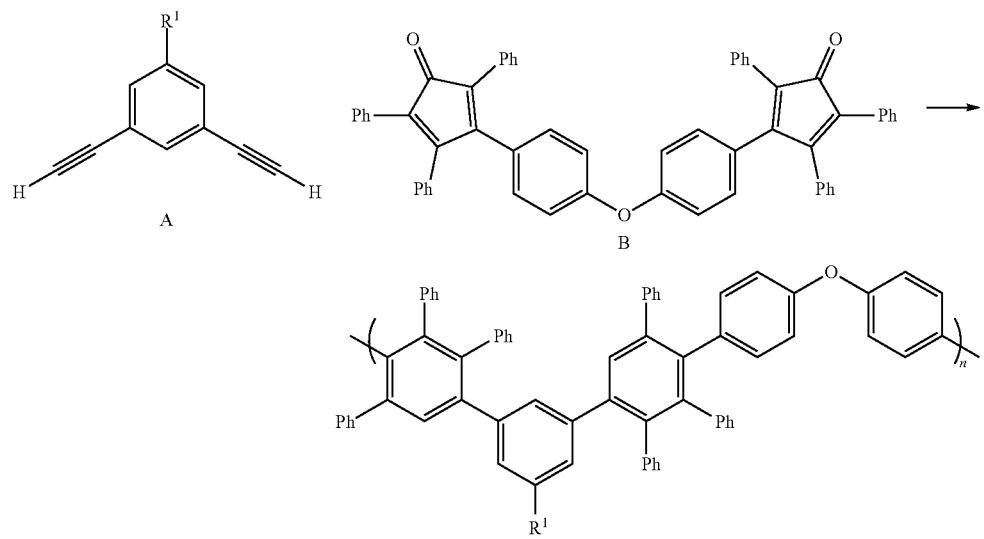

The coating compositions of the invention comprise one or more polyarylene resins described above and one or more organic solvents. The present resins in the organic reaction solvent can be directly cast as a film, applied as a coating or poured into a non-solvent to precipitate the resin. Water, methanol, ethanol and other similar polar liquids such as glycol ethers are typical non-solvents which can be used to precipitate the resin. Solid resin may be dissolved and processed from a suitable organic solvent described above, or from organic solvents typically used in the electronics industry. Preferred organic solvents useful in the present coating compositions are propylene glycol methyl ether (PGME), propylene glycol methyl ether acetate (PGMEA), methyl 3-methoxypropionate (MMP), ethyl lactate, n-butyl acetate, anisole, N-methyl pyrrolidone, gamma-butyrolactone (GBL), ethoxybenzene, benzyl propionate, benzyl benzoate, propylene carbonate, methyl 2-hydroxyisobutyrate, cyclohexanone, and mixtures thereof. Mixtures of organic solvents are particularly preferred, such as a mixture comprising one or more of anisole, ethoxybenzene, PGME, PGMEA, GBL, MMP, n-butyl acetate, benzyl propionate and benzyl benzoate in combination with one or more additional organic solvents, and more preferably a mixture comprising two or more of anisole, ethoxybenzene, PGME, PGMEA, GBL, MMP, n-butyl acetate, benzyl propionate, and benzyl benzoate. When a mixture of solvents is used, the ratio of solvents is generally not critical and may vary from 99:1 to 1:99 w/w. The solubility enhancing moieties pendent from the backbone of the present resins provide improved solubility as compared to polyarylene resins without such solubility enhancing moieties. It will be appreciated by those skilled in the art that the concentration of the resin in the organic reaction solvent may be adjusted by removing a portion of the organic solvent, or by adding more of the organic solvent, as may be desired.

Optionally, the present coating compositions may further comprise one or more additives, such as additives chosen from curing agents, crosslinking agents, and surface leveling agents. The selection of such optional additives and their amounts are well within the ability of those skilled in the art. Curing agents are typically present in an amount of from 0 to 20 wt % based on total solids, and preferably from 0 to 3 wt %. Crosslinking agents are typically used in an amount of from 0 to 30 wt % based on total solids, and preferably from 3 to 10 wt %. Surface leveling agents are typically used in an amount of from 0 to 5 wt % based on total solids, and preferably from 0 to 1 wt %. The selection of such optional additives and their amounts used are within the ability of those skilled in the art.

Curing agents may optionally be used in the coating compositions to aid in the curing of the deposited aromatic resin film. A curing agent is any component which causes curing of the polymer on the surface of a substrate. Preferred curing agents are acids and thermal acid generators. Suitable acids include, but are not limited to: arylsulfonic acids such as p-toluenesulfonic acid; alkyl sulfonic acids such as methanesulfonic acid, ethanesulfonic acid, and propanesulfonic acid; perfluoroalkylsulfonic acids such as trifluoromethanesulfonic acid; and perfluoroarylsulfonic acids. A thermal acid generator is any compound which liberates acid upon exposure to heat. Thermal acid generators are well-known in the art and are generally commercially available, such as from King Industries, Norwalk, Conn. Exemplary thermal acid generators include, without limitation, amine blocked strong acids, such as amine blocked sulfonic acids such as amine blocked dodecylbenzenesulfonic acid. It will also be appreciated by those skilled in the art that certain photoacid generators are able to liberate acid upon heating and may function as thermal acid generators.

The present coating compositions may optionally include one or more surface leveling agents (or surfactants). While any suitable surfactant may be used, such surfactants are typically non-ionic. Exemplary non-ionic surfactants are those containing an alkyleneoxy linkage, such as ethyleneoxy, propyleneoxy, or a combination of ethyleneoxy and propyleneoxy linkages.

The present resins are useful in the manufacture of various electronic devices, such as in a process of forming a patterned layer comprising coating a layer of the aromatic resin composition described above on a substrate; removing organic solvent to form an aromatic resin underlayer; coating a layer of a photoresist on the aromatic resin underlayer; exposing the photoresist layer to actinic radiation through a mask; developing the exposed photoresist layer to form a resist pattern; and transferring the pattern to the aromatic resin underlayer to expose portions of the substrate. In one preferred embodiment, a layer of photoresist is coated directly on the aromatic resin layer. In an alternate preferred embodiment, a layer of a silicon-containing composition is coated directly on the aromatic resin layer and a layer of photoresist is coated directly on the silicon-containing composition layer.

The present compositions may be coated on an electronic device substrate by any suitable means, such as spin-coating, slot-die coating, doctor blading, curtain coating, roller coating, spray coating, dip coating, and the like. Spin-coating is preferred. In a typical spin-coating method, the present compositions are applied to a substrate which is spinning at a rate of 500 to 4000 rpm for a period of 15 to 90 seconds to obtain a desired layer of the aromatic resin reaction product on the substrate. It will be appreciated by those skilled in the art that the height of the aromatic resin layer may be adjusted by changing the spin speed.

A wide variety of electronic device substrates may be used in the present invention, such as: packaging substrates such as multichip modules; flat panel display substrates; integrated circuit substrates; substrates for light emitting diodes (LEDs) including organic light emitting diodes (OLEDs); semiconductor wafers; polycrystalline silicon substrates; and the like. Such substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable substrates may be in the form of wafers such as those used in the manufacture of integrated circuits, optical sensors, flat panel displays, integrated optical circuits, and LEDs. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated.

Optionally, a layer of an adhesion promoter may be applied to the substrate surface before the deposition of the polyarylene resin layer, which is subsequently cured to form the crosslinked polyarylene film. If it is desired to use an adhesion promoter, any suitable adhesion promoter for polyarylene films may be used, such as silanes, preferably organosilanes such as trimethoxyvinylsilane, triethoxyvinylsilane, hexamethyldisilazane [$(CH_3)_3Si-NH-Si(CH_3)_3$], or an aminosilane coupler such as gamma-aminopropyltriethoxysilane, or a chelate such as aluminum monoethylacetoacetatedi-isopropylate [$((i-C_3H_7O)_2Al(OCOC_2H_5CHCOCH_3))$]. In some cases, the adhesion promoter is applied from 0.01 to 5 wt % solution, excess solution is removed, and then the polyarylene oligomer is applied. In other cases, for example, a chelate of aluminum monoethylacetoacetatedi-isopropylate, can be incorporated onto a substrate by spreading a toluene solution of the chelate on a substrate and then baking the coated substrate at 350° C. for 30 min. in air to form a very thin (for example 5 nm) adhesion promoting layer of aluminum oxide on the surface. Other means for depositing aluminum oxide are likewise suitable. Alternatively, the adhesion promoter, in an amount of, for example, from 0.05 to 5 wt % based on the weight of the monomer, can be blended with the monomers before polymerization, negating the need for formation of an additional layer. Particularly suitable adhesion promoters include those sold under the AP 3000, AP 8000, and AP 9000S designations, available from Dow Electronic Materials (Marlborough, Mass.).

After being coated on the substrate, the aromatic resin layer is optionally baked at a relatively low temperature to remove any organic solvent and other relatively volatile components from the layer. Typically, the substrate is baked at a temperature of 90 to 140° C., although other suitable temperatures may be used. The baking time is typically from 10 seconds to 10 minutes, and preferably from 30 seconds to 5 minutes, although longer or shorter times may be used. When the substrate is a wafer, such baking step may be performed by heating the wafer on a hot plate. Following solvent removal, a layer, film or coating of the resin on the substrate surface is obtained.

The aromatic resin underlayer is then sufficiently cured such that the film does not intermix with a subsequently applied coating layer, such as a photoresist or other layer coated directly on the aromatic underlayer. The aromatic resin underlayer may be cured in an oxygen-containing atmosphere, such as air, or in an inert atmosphere, such as nitrogen, and preferably in an oxygen-containing atmosphere. The curing conditions used are those sufficient to cure the film such that it does not intermix with a subsequently applied organic layer, such as a photoresist layer, while still maintaining the desired antireflective properties (n and k values) and etch selectivity of the underlayer film. This curing step is conducted preferably on a hot plate-style apparatus, though oven curing may be used to obtain equivalent results. Typically, such curing is performed by heating the aromatic resin layer at a curing temperature of ≥250° C., preferably ≥350° C., and more preferably ≥400° C. The curing temperature selected should be sufficient to cure the aromatic resin underlayer. Such curing step may take from 10 sec. to 10 min., preferably from 1 to 3 min., and more preferably from 1 to 2 min., although other suitable times may be used. It is possible that certain solubility enhancing moieties, such as —C(=O)OH, may be cleaved from the polyarylene backbone during a thermal curing step.

The initial baking step may not be necessary if the curing step is conducted in such a way that rapid evolution of the solvents and curing by-products is not allowed to disrupt the underlayer film quality. For example, a ramped bake beginning at relatively low temperatures and then gradually increasing to a temperature of ≥300° C. can give acceptable results. It can be preferable in some cases to have a two-stage curing process, with the first stage being a lower bake temperature of less than 200° C., and the second stage being a higher bake temperature of ≥300° C. Two stage curing processes facilitate uniform filling and planarization of pre-existing substrate surface topography, for example filling of trenches and vias.

After curing of the aromatic resin underlayer, one or more processing layers, such as photoresists, silicon-containing layers, hardmask layers, bottom antireflective coating (or BARC) layers, and the like, may be coated on the cured underlayer. For example, a photoresist may be coated, such as by spin coating, directly on the surface of a silicon-containing layer or other middle layer which is directly on the resin underlayer, or, alternatively, the photoresist may be coated directly on the cured aromatic resin underlayer. A wide variety of photoresists may be suitably used, such as those used in 193 nm lithography, such as those sold under the EPIC™ brand available from Dow Electronic Materials (Marlborough, Mass.). Suitable photoresists may be either positive tone development or negative tone development resists. Following coating, the photoresist layer is then imaged (exposed) using patterned actinic radiation, and the exposed photoresist layer is then developed using the appropriate developer to provide a patterned photoresist layer. The pattern is next transferred from the photoresist layer to the underlayers by an appropriate etching techniques. Typically, the photoresist is also removed during such etching step. Next, the pattern is transferred to the substrate and the underlayer removed by appropriate etching techniques known in the art, such as by plasma etching. Following patterning of the substrate, the underlayer is removed using conventional techniques. The electronic device substrate is then processed according to conventional means.

The cured aromatic resin underlayer may be used as the bottom layer of a multilayer resist process. In such a process, a layer of the aromatic resin is coated on a substrate and cured as described above. Next, one or more middle layers are coated on the aromatic resin underlayer. For example, a silicon-containing layer or a hardmask layer is coated directly on the aromatic resin underlayer. Exemplary silicon-containing layers include a silicon-BARC, which may be spin coated on the underlayer followed by curing, or an inorganic silicon layer such as SiON or $SiO_2$ which may be deposited on the underlayer by chemical vapor deposition (CVD). Any suitable hardmask may be used and may be deposited on the underlayer by any suitable technique, and cured as appropriate. Optionally, an organic BARC layer may be disposed directly on the silicon-containing layer or hardmask layer, and appropriately cured. Next, a photoresist, such as those used in 193 nm lithography, is coated directly on the silicon-containing layer (in a trilayer process) or directly on the organic BARC layer (in a quadlayer process). The photoresist layer is then imaged (exposed) using patterned actinic radiation, and the exposed photoresist layer is then developed using the appropriate developer to provide a patterned photoresist layer. The pattern is next transferred from the photoresist layer to the layer directly below it, by appropriate etching techniques known in the art, such as by plasma etching, resulting in a patterned silicon-containing layer in a trilayer process and a patterned organic BARC layer in a quadlayer process. If a quadlayer process is used, the pattern is next transferred from the organic BARC layer to the silicon-containing layer or hardmask layer using appropriate pattern transfer techniques, such as plasma etching. After the silicon-containing layer or hardmask layer is patterned, the aromatic resin underlayer is then patterned using appropriate etching techniques, such as $O_2$ or $CF_4$ plasma. Any remaining patterned photoresist and organic BARC layers are removed during etching of the aromatic resin underlayer. Next, the pattern is transferred to the substrate, such as by appropriate etching techniques, which also removes any remaining silicon-containing layer or hardmask layer, followed by removal of any remaining patterned aromatic resin underlayer to provide a patterned substrate.

Aromatic resins of the invention may also be used in a self-aligned double patterning process. In such a process, a layer of an aromatic resin described above is coated on a substrate, such as by spin-coating. Any remaining organic solvent is removed and the aromatic resin layer is cured to form an aromatic resin underlayer. A suitable middle layer, such as a silicon-containing layer is coated on the aromatic resin underlayer. A layer of a suitable photoresist is then coated on the middle layer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the middle layer and the aromatic resin underlayer by appropriate etching techniques to expose portions of the substrate. Typically, the photoresist is also removed during such etching step. Next, a conformal silicon-containing layer is disposed over the patterned aromatic resin underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the underlayer pattern. Next, the silicon-containing layer is partially etched (trimmed) to expose a top surface of the patterned aromatic resin underlayer and a portion of the substrate. Following this partial etching step, the pattern on the substrate comprises a plurality of features, each feature comprising a line or post of the aromatic resin underlayer with the silicon-containing layer directly adjacent to the sides of each aromatic resin underlayer feature. Next, the aromatic resin underlayer is removed, such as by etching, to expose the substrate surface that was under the aromatic resin underlayer pattern, and providing a patterned silicon-containing layer on the substrate surface, where such patterned silicon-containing layer is doubled (that is, twice as many lines and/or posts) as compared to the patterned aromatic resin underlayer.

The presence of solubility enhancing moieties pendent from the polymer backbone greatly enhances the solubility of the polyarylene resins as compared to conventional polyarylene resins and allows such resins to be used as underlayers. The polyarylene resins of the invention are particularly useful in forming aromatic underlayers having good antireflective properties useful in the manufacture of integrated circuits.

The polyarylene resins of the invention are also useful in forming planarizing layers, gap filling layers, and protective layers in the manufacture of integrated circuits. When used as such planarizing layers, gap filling layers, or protective layers, one or more intervening material layers, such as silicon-containing layers, other aromatic resin layers, hardmask layers, and the like, are typically present between the layer of the present polyarylene resin and any photoresist layer. Typically, such planarizing layers, gap filling layers, and protective layers are ultimately patterned. A gap-filling process according to the invention comprises: (a) providing a semiconductor substrate having a relief image on a surface of the substrate, the relief image comprising a plurality of gaps to be filled; (b) applying a gap-fill composition over the relief image, wherein the gap-fill composition comprises: (i) a polyarylene resin comprising as polymerized units: one or more first monomers of formula (1) and one or more second monomers comprising two cyclopentadienone moieties;

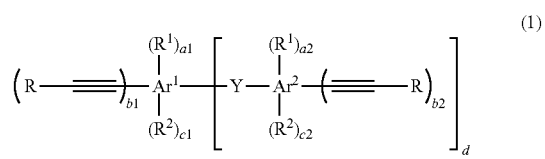

wherein each $Ar^1$ and $Ar^2$ is independently a $C_{6-30}$-aryl moiety; each R is independently chosen from H, $C_{6-30}$-aryl, and substituted $C_{6-30}$-aryl; each $R^1$ is independently chosen from —OH, $C_{1-6}$-hydroxyalkyl, —C(=O)$OR^3$, —C(=O)N($R^4$)$_2$, —O—C(=O)$R^5$, —$NR^4$C(=O)$R^6$, —N($R^4$)$_3^+$ $An^-$, —$NO_2$; S(=O)$_2$—$OR^7$, —O—S(=O)$_2$—$R^8$, —$NR^4$—S(=O)$_2$—$R^6$, and S(=O)$_2$—N($R^4$)$_2$; each $R^2$ is independently chosen from $C_{1-10}$-alkyl, $C_{1-10}$-haloalkyl, $C_{1-10}$-hydroxyalkyl, $C_{1-10}$-alkoxy, CN, —N($R^4$)$_2$, and halo $R^3$=H, $C_{1-10}$-alkyl, $C_{1-10}$-hydroxyalkyl, $C_{1-10}$-aminoalkyl, $C_{6-30}$-aryl, or M; each $R^4$ is independently H, $C_{6-30}$-aryl or $C_{1-10}$-alkyl; each $R^5$ is independently chosen from H, $C_{1-10}$-alkyl, $C_{1-10}$-hydroxyalkyl, $C_{6-30}$-aryl, —O($C_{1-10}$-alkyl), —O($C_{6-10}$-aryl) and N($R^4$)$_2$; $R^6$=H, $C_{1-10}$-alkyl, $C_{1-10}$-hydroxy alkyl, $C_{6-30}$-aryl, —O($C_{1-10}$-alkyl), or NH($C_{1-10}$-alkyl); $R^7$=H, $C_{1-10}$-alkyl, $C_{6-30}$-aryl, or M; $R^8$=$C_{6-30}$-aryl, $C_{1-10}$-alkyl, and halo-$C_{1-10}$-alkyl; M=an alkali metal ion, an alkaline earth metal ion, or an ammonium ion; $An^-$ is an anion chosen from halide and $C_{1-20}$ carboxylate; each Y is independently a single chemical bond or a divalent linking group chosen from —O—, —S—, —S(=O)—, —S(=O)$_2$—, —C(=O)—, —(C($R^9$)$_2$)$_z$—, $C_{6-30}$-aryl, and (C($R^9$)$_2$)$_{z1}$—($C_{6-30}$-aryl)-(C($R^9$)$_2$)$_{z2}$—; each $R^9$ is independently chosen from H, hydroxy, halo, $C_{1-10}$-alkyl, $C_{1-10}$-haloalkyl, and $C_{6-30}$-aryl; a1=0 to 3; a2=0 to 3; b1=1 to 4; b2=0 to 2; c1=0 to 2; c2=0 to 2; a1+a2=1 to 6; b1+b2=2 to 6; c1+c2=0 to 6; d=0 to 2; z=1 to 10; z1=0 to 10; z2=0 to 10; and z1+z2=1 to 10; and (ii) one or more organic solvents; and (c) heating the gap-fill composition at a temperature to cure the polyarylene resin. The present compositions substantially fill, preferably fill, and more preferably fully fill, a plurality of gaps in a semiconductor substrate.

Example 1

Preparation of 3,5-Diethynylphenol 3,5-Dibromophenol (100.0 g) was added to 162.1 g of acetic anhydride at room temperature to yield a light yellow solution. The reaction was stirred at 70° C. for 6 hr. The reaction mixture was then slowly added into ice water and a white precipitate was formed. After stirring at room temperature for 0.5 hr., the solid product was collected by filtration and dried under vacuum for 12 hr. to provide 102.0 g of 3,5-dibromophenyl acetate as a light yellow solid in 88% yield.

3,5-Dibromophenyl acetate (50.0 g) was added to 133.0 g of 1,4-dioxane at room temperature to yield a yellow solution. Triethylamine (51.6 g) and cuprous iodide (3.23 g) were added to the reaction mixture. The reaction mixture was purged with nitrogen for 1 hr. Bis(triphenylphosphine) palladium(II) chloride (5.962 g) was added to the reaction mixture. Next, 41.8 g of (trimethylsilyl)acetylene was slowly added to reaction mixture via an addition funnel. After completion of addition, the reaction was stirred for 24 hr. at 55° C. under nitrogen. After complete conversion, the product was filtered and solvents were evaporated. The residue was dissolved in heptanes and filtered through a silica plug. After filtration, the solvents were removed to yield 3,5-bis(trimethylsilylethynyl)phenyl acetate as a light yellow solid (51.0 g) in 91% yield.

3,5-Bis(trimethylsilylethynyl)phenyl acetate (51.0 g) was dissolved in tetrahydrofuran (THF, 186 g) and water (46 g). The mixture was combined with 21.4 g of lithium hydroxide monohydrate at room temperature to yield a dark black reaction mixture. The reaction mixture was stirred for 6 hr. at 55° C. under nitrogen. The reaction mixture was then diluted with ethyl acetate and then treated with hydrochloric acid until the pH of aqueous layer is 4 to 5. The organic phase was separated and aqueous phase was extracted with ethyl acetate (60 mL×3). The organic phase was washed with brine (1266 mL) and dried with $MgSO_4$ (10 g). The mixture was then filtered and evaporated under vacuum to give 3,5-diethynylphenol (DEPOH) as a light yellow solid (19.8 g) in 90.0% yield. The overall reaction is shown in Scheme 2.

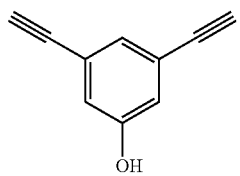

Example 2

Preparation of 3,5-Bis(Phenylethynyl)Phenol

The overall reaction is shown in Scheme 3. 3,5-Dibromophenol acetate (44.1 g) from Example 1 and cuprous iodide (2.88 g) were added into a round bottom flask under nitrogen. To this solution, 1,4-dioxane (80 mL), triethylamine (45.5 g) and bis(triphenylphosphine)palladium(II) chloride (5.25 g) were added. Phenylacetylene (45.9 g) was added dropwise to the reaction at room temperature. After the addition, the reaction was heated to 70° C. and stirred overnight. The reaction mixture was cooled to room temperature, and the solvent was removed by rotary evaporation. A mixture of ethyl acetate and heptanes (200 mL, 1:10 v/v) was added to the residue mixture, and the mixture was filtered through Celite. The filtrates were combined and concentrated, and 150 mL heptane was added. The mixture was stirred for 1 hr., and filtered and dried to obtain 3,5-bis(phenylethynyl)phenol acetate as a yellow solid (40.7 g, 81% yield). This obtained solid (3,5-bis(phenylethynyl) phenol acetate) was dissolved in THF (140 mL) under nitrogen and 32 g of water were added, and the mixture was stirred at 60° C. for 3 hr. The reaction mixture was then diluted with ethyl acetate and then treated with hydrochloric acid until the pH of aqueous layer was 4 to 5. The organic phase was separated and aqueous phase was extracted with ethyl acetate. The organic layers were combined and solvent was removed under vacuum. A mixture of ethyl acetate and heptanes (3:1 v/v, 80 mL) was added to the organic layer. The mixture was filtered through silica gel, and washed with this solvent until thin layer chromatography showed no product on silica gel. The solvent was removed under vacuum, and heptane (150 mL) was added. The mixture was stirred for 1 hr., filtered and dried under vacuum to obtain the product, 3,5-bis(phenylethynyl)phenol (BPEPOH), as a yellow solid (30.5 g) in 86% yield.

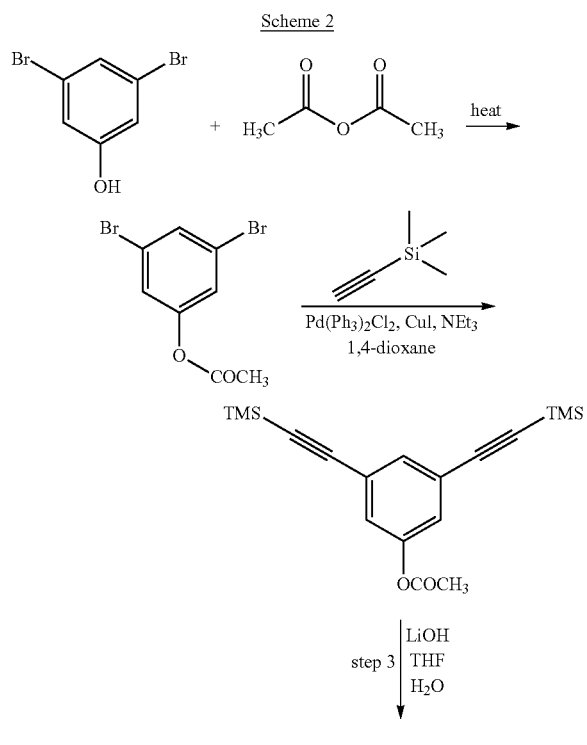

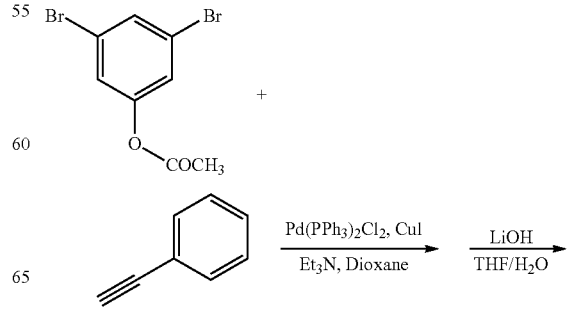

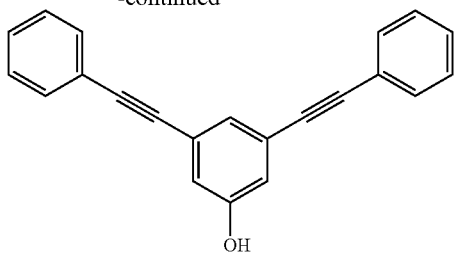

Example 3

Preparation of 6,6'-Diethynyl-[1,1'-binaphthalene]-2,2'-diol 2,2'-Dihydroxy-6,6'-dibromo-1,1'-binaphthalene (40 g) was added to 55.1 g of acetic anhydride and 42.7 g pyridine in 250 mL dichloromethane to yield a light yellow solution. The reaction mixture was stirred at room temperature for 24 hr. The product was washed with water (3×250 mL) and the organic layer was dried over anhydrous MgSO$_4$. Removal of organic solvents gave 6,6'-dibromo-2,2'-diacetyl-1,1'-binaphthalene as the desired product as light yellow solid (44.0 g) in 93% yield.

6,6'-Dibromo-2,2'-diacetyl-1,1'-binaphthalene (9.4 g) was added to 26.1 g of 1,4-dioxane at room temperature to yield a yellow solution. Triethylamine (5.6 g) and cuprous iodide (0.35 g) was added to the reaction mixture. The reaction mixture was purged with nitrogen for 1 hr. Bis(triphenylphosphine)palladium(II) chloride (0.975 g) was added to the reaction mixture. Trimethylsilylacetylene (5.5 g) was then slowly added to reaction mixture by way of an addition funnel. After completion of addition, the reaction was stirred for 24 hr. at 55° C. under nitrogen. The mixture was filtered and solvents were evaporated. The residue was dissolved in heptanes and filtered through a silica plug. After filtration, the solvents were removed to yield a light yellow solid which was used in next step.

The product from previous step was dissolved in 36.4 g of THF and 8.96 g of water. To the mixture was added 4.67 g of lithium hydroxide monohydrate at room temperature to yield a dark black solution. The reaction was stirred for 24 hr. at 55° C. under nitrogen. The reaction mixture was diluted with ethyl acetate and then treated with hydrochloric acid until the pH of aqueous layer was 4 to 5. The organic phase was separated and aqueous phase was extracted with ethyl acetate (3×30 mL). The organic phase was then washed with brine and dried with MgSO$_4$. The mixture was then filtered and evaporated under vacuum to give 6,6'-diethynyl-[1,1'-binaphthalene]-2,2'-diol as a light yellow solid (4.97 g) in 83% yield.

Example 4

Preparation of Polymer 1

Diphenylene oxide bis-(triphenylcyclopentadienone) (DPO-CPD, 9.0 g) and DEPOH (1.96 g) from Example 1 were dissolved in 97 g of gamma-butyrolactone (GBL). The reaction was heated at 120° C. for 1 hr. and then 130° C. for 1 hr. and then 150° C. for 1.5 hr. The mixture was cooled to room temperature and then diluted with 10 g of GBL. The reaction mixture was slowly added to warm water. The precipitated polymer (Polymer 1) was collected by filtration and then dried in vacuum oven at 65 to 70° C. for 2 days yielding 10.0 g of a brown solid in 97% yield. Analysis by GPC provided M$_w$=9300 and polydispersity (PDI)=2.07. M$_w$ was determined by gel permeation chromatography using polystyrene standards. PDI was determined by M$_w$/M$_n$, where M$_n$ is the number average molecular weight determined by a dynamic light scattering sensor on the GPC. This reaction is illustrated in reaction scheme 4.

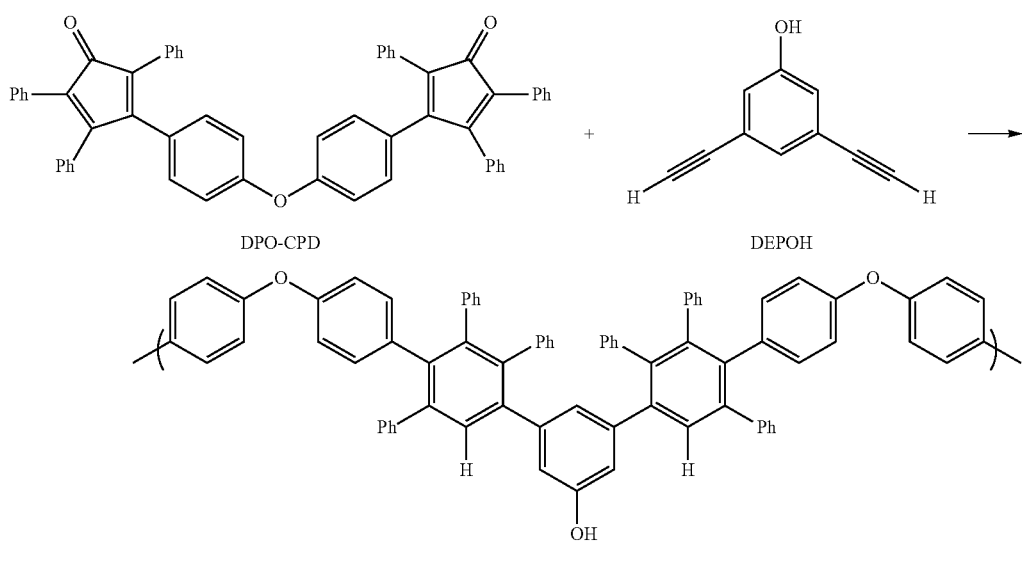

Scheme 4

Example 5

Preparation of Polymer 2

DPO-CPD (9.0 g) and DEPOH (1.37 g) from Example 1 were dissolved in 97 g of GBL. The reaction was heated at 130° C. for 2 hr. and then cooled down to 80° C. 1,3,5-Tris (phenylethynyl)benzene (TRIS, 1.57 g) was then added to reaction mixture at 80° C. The reaction was then heated at 190° C. for 16 hr. The reaction mixture was cooled to room temperature, diluted with GBL (10 g) then slowly added to warm water. The precipitated polymer was collected by filtration and then dried in vacuum oven at 65 to 70° C. for 2 days. Polymer 2 was obtained as a brown solid (10.1 g) in 98% yield. GPC analysis: $M_w$=7060, PDI=3.71.

Example 6

Preparation of Polymer 3

DPO-CPD (8.0 g) and BPEPOH (2.81 g) were dissolved in 24 g of GBL. The reaction mixture was heated at 204° C. for 24 hr. and then cooled to 100° C. TRIS (0.638 g) was added to the reaction mixture at 100° C. The reaction was then heated at 204° C. for 8 hr. The solution was cooled to room temperature and then diluted with 5 g of GBL. The reaction mixture was slowly added to 400 g isopropanol and stirred at room temperature for 30 min. The precipitated polymer was collected by filtration. The polymer collected was added to 400 g of warm water (60-70° C.) and stirred at 60-70° C. for 30 min. The polymer (Polymer 3) was collected by filtration and then dried in vacuum oven at 65 to 70° C. for 2 days to provide 11 g of a brown solid in 96% yield. GPC analysis: $M_w$=5523, PDI=1.92.

Example 7

Preparation of Polymer 4

DPO-CPD (10.0 g) and BPEPOH (3.52 g) were dissolved in 29 g of GBL. The reaction was heated at 204° C. for 24 hr. and then cooled to 80° C. Diethynylbenzene (DEB) (0.256 g) was added to reaction at 80° C. The reaction was then heated at 130° C. for 2 hr. The solution was cooled to room temperature and then diluted with 5 g of GBL. The reaction mixture was slowly added to 500 g isopropanol and stirred at room temperature for 30 min. The precipitated polymer was collected by filtration. The polymer collected was added to 500 g of warm water (60-70° C.) and stirred at 60-70° C. for 30 min. The polymer (Polymer 4) was collected by filtration and then dried in vacuum oven at 65 to 70° C. for 2 days to provide 13 g of a brown solid in 95% yield. GPC analysis: $M_w$=5178, PDI=1.71.

Example 8

Preparation of Polymer 5

DPO-CPD (5.0 g) and BPEPOH (2.07 g) were dissolved in 16.5 g of GBL. The reaction was heated at 204° C. for 30 hr. The solutions were cooled to room temperature and then diluted with 3 g of GBL. The reaction mixture was slowly added to 250 g isopropanol and stirred at room temperature for 30 min. The precipitated polymer was collected by filtration. The polymer collected was added to 250 g of warm water (60-70° C.) and stirred at 60-70° C. for 30 min. Polymer 5 was collected by filtration and then dried in vacuum oven at 65 to 70° C. for 2 days to provide 7 g of a brown solid in 88% yield. GPC analysis: $M_w$=5265, PDI=1.68.

Example 9

Preparation of Polymer 6

DPO-CPD (7.83 g) and BPEPOH (2.75 g) were dissolved in 43 g of GBL. The reaction was heated at 205° C. for 20 hr. and then cooled to room temperature. DEPOH (0.23 g) was then added to reaction mixture at room temperature. The reaction was then heated at 150° C. for 2 hr. The reaction mixture was cooled to room temperature, and slowly added to isopropanol (500 mL). The precipitated polymer was collected by filtration, and added to warm water (500 mL) and stirred for 1 hr. at 70° C. The mixture was cooled to room temperature, and the precipitated polymer was collected by filtration. The polymer was then dried in vacuum oven at 60° C. for 2 days. Polymer 6 was obtained as a brown solid (8.1 g) in 79% yield. GPC analysis: $M_w$=3400, PDI=2.0.

Example 10

Preparation of Polymer 7

DPO-CPD (8.61 g) and BPEPOH (1.78 g) were dissolved in 45 g of GBL. The reaction was heated at 205° C. for 17 hr. and then cooled down to room temperature. DEPOH (0.86 g) was then added to reaction mixture at room temperature. The reaction was then heated at 150° C. for 4 hr. The reaction mixture was cooled to room temperature, and slowly added to isopropanol (500 mL). The precipitated polymer was collected by filtration, and added to warm water (500 mL) and stirred for 1 hr. at 70° C. The mixture was cooled to room temperature, and the precipitated polymer was collected by filtration. The polymer was then dried in vacuum oven at 60° C. for 2 days. Polymer 7 was obtained as a yellow solid (10.2 g) in 95% yield. GPC analysis: $M_w$=10170, PDI=2.0.

Example 11

Preparation of Polymer 8

DPO-CPD (6.0 g) and 6,6'-diethynyl-[1,1'-binaphthalene]-2,2'-diol (3.07 g) were dissolved in 97 g of GBL. The reaction was heated at 120° C. for 1 hr. The temperature was then raised to 130° C. and held there for 1 hr. The temperature was then raised to 150° C. and held there for 1 hr. The mixture was cooled to room temperature and then diluted with 3 g of GBL. The reaction mixture was slowly added to warm water (1 L, 60-70° C.) and stirred for 30 min. The polymer was collected by filtration and then added to warm water (1 L, 60-70° C.) and stirred at 60-70° C. for another 30 min. Polymer 8 was collected by filtration and then dried in vacuum oven at 65 to 70° C. for 2 days to provide 7.1 g as a brown solid in 78% yield. GPC analysis: $M_w$=12074, PDI=2.56.

Comparative Example 1

A polymer having only DPO-CPD and TRIS as polymerized units was made according to the general procedure disclosed in International Patent Application WO 97/10193 and used as Comparative Polymer 1.

Example 12

Polymers 1-8 and Comparative Polymer 1 were formulated in a mixture of PGMEA and benzyl benzoate at approximately 5 wt % solids Polymers 1 and 2 were also formulated in the same solvent mixture with Nikalac MW-390H (Sanwa Chemical Co.) as a crosslinker. Conventional surface leveling agents (0.5 wt % of solids) were added to each formulation. The obtained solutions were filtered through a 0.2 μm poly (tetrafluoroethylene) (PTFE) syringe filter. The formulations are summarized in Table 1.

TABLE 1

| Formulation | Polymer | Crosslinker |
|---|---|---|
| 1 | Polymer 1 | — |
| 2 | Polymer 1 | 7.5 wt % |
| 3 | Polymer 2 | — |
| 4 | Polymer 2 | 7.5 wt % |
| 5 | Polymer 3 | — |
| 6 | Polymer 4 | — |
| 7 | Polymer 5 | — |
| 8 | Polymer 6 | — |
| 9 | Polymer 7 | — |
| 10 | Polymer 8 | — |
| Comparative 1 | Comparative Polymer 1 | — |

Comparative Example 2

1-Naphthol/formaldehyde novolac polymer (purchased from Gun ei Chemical Co.) was formulated in a mixture of PGMEA and Ethyl lactate (60:40 w/w) with Nikalac MW-390H (Sanwa Chemical Co.) as a crosslinker (6 wt % of solids), triethylammonium para-toluenesulfonic acid (1 wt % of solids) and a conventional surface leveling agents (0.1 wt % of solids). The obtained solutions were filtered through a 0.2 μm PTFE syringe filter to provide Comparative 2 formulation.

Example 13

The formulation samples from Example 12 were mixed with solvents commonly used in semiconductor industry indicated in Table 2, and their compatibility was evaluated by mixing the samples and the solvent at 1 10 weight ratio. Turbidity of the resulting mixture was measured by a Turbidity meter from Orbeco-Hellige Co. Samples having a turbidity value of less than 1 were rated "pass", and those having a turbidity value higher than 1 were rated "fail". Table 2 shows the result of these turbidity determinations. Formulation samples of the invention showed good compatibility with various conventional clean room track solvents whereas the comparative formulation sample showed limited compatibility.

TABLE 2

| Formulation | PGMEA/PGME 3/7 w/w | PGME | Cyclo-hexanone | Ethyl lactate |
|---|---|---|---|---|
| 1 | Pass | Pass | Pass | Pass |
| 2 | Pass | Pass | Pass | Pass |
| 3 | Pass | Pass | Pass | Pass |
| 4 | Pass | Pass | Pass | Pass |

TABLE 2-continued

| Formulation | PGMEA/PGME 3/7 w/w | PGME | Cyclo-hexanone | Ethyl lactate |
|---|---|---|---|---|
| 5 | Pass | Pass | Not tested | Not tested |
| 6 | Pass | Pass | Not tested | Not tested |
| 7 | Pass | Pass | Not tested | Not tested |
| 8 | Pass | Pass | Not tested | Not tested |
| 9 | Pass | Pass | Not tested | Not tested |
| 10 | Pass | Pass | Not tested | Not tested |
| Comparative 1 | Fail | Fail | Pass | Fail |

Example 14

The formulations from Example 12 were coated on silicon wafers at 1500 rpm and baked at 350° C. for 60 sec. to give films having an approximate thickness of 120 nm. Optical constants of the cured films were measured by VUV-VASE variable angle spectroscopic ellipsometer from J.A. Woollam Co. These results for films from Formula 1 and Comparative Formulation are reported in Table 3.

TABLE 3

| | Formulation 1 | Comparative Formulation |
|---|---|---|
| n/k (193 nm) | 1.56/0.76 | 1.63/0.80 |
| n/k (248 nm) | 1.77/0.43 | 1.76/0.34 |
| n/k (633 nm) | 1.64/0.00 | 1.64/0.00 |

Example 15

Thermal stability of cured films formed from the Formulations from Example 12 were measured using a Thermal Gravimetric Analyzer (TGA Q5000) from TA-Instrument. The sample size was 1-3 mg, and the heating recipe is as follows: under nitrogen atmosphere, ramp at 10° C./min to 150° C., isotherm at 150° C. for 10 min., ramp at 10° C./min to 700° C. The temperature that gave 5 wt % loss from the original weight was defined as thermal decomposition temperature ($T_{d(5\%)}$). Films having a $T_{d(5\%)}$ above 450° C. were considered to "pass", while films having a $T_{d(5\%)}$<450° C. were considered to "fail". The TGA data are summarized in Table 4. Films formed from the formulations of the invention showed excellent thermal stability.

TABLE 4

| Formulation | $T_{d(5\%)}$ | Pass or fail |
|---|---|---|
| 1 | 494 | pass |
| 3 | 491 | pass |
| 5 | 518 | pass |
| 6 | 522 | pass |
| 7 | 512 | pass |
| 8 | 493 | pass |
| 9 | 522 | pass |
| 10 | 475 | pass |
| Comparative 1 | 500 | pass |

Example 16

Solvent strip resistance of films formed from the present resins was measured as an indication of film crosslinking. The formulations from Example 12 were coated on silicon wafers at 1500 rpm for 30 sec. and baked at 350° C. for 60 sec. to give a film. The film thickness (FT) was measured an OptiProbe™ from Therma-wave Co. PGMEA was applied onto the films for 90 seconds followed by a post strip baking (PSB) at 105° C. for 60 seconds. The film retention was calculated as [(FT after PSB) (FT before strip)]/(FT before strip)×100 [%]. As Table 5 indicates, films formed from the formulations of the invention efficiently crosslink by themselves or in the presence of a crosslinker.

TABLE 5

| | Film From: | | | |
|---|---|---|---|---|
| | Formulation 1 | Formulation 2 | Formulation 4 | Comparative Formulation |
| Film retention: | 100% | 100% | 100% | <10% |

Example 17

Formulation 1 and the Comparative Formulation from Example 6 were each coated on silicon wafers at 1500 rpm for 30 sec. and baked at 350° C. for 60 sec. to give a film. The cured films were etched using $O_2$ plasma using a Plasmatherm RIE790 tool (from Plasma-Therm Co.) and the conditions shown in Table 6. The etching data, in Å/sec., are reported in Table 7.

TABLE 6

| Gas | $Ar/O_2$ |
|---|---|
| Flow (sccm) | 60/20 |
| Power (W) | 300 |
| Pressure (mTorr) | 10 |
| Etch time (sec.) | 60 |

TABLE 7

| Film Sample | $O_2$ Etch - Å/sec. |
|---|---|
| Formulation 1 | 11.7 |
| Comparative Formulation | 10.6 |

Example 18 Formulation 1 from Example 12 was spin-coated onto a 200 mm diameter silicon wafer and then baked at 350° C. for 60 sec. to obtain an underlayer film having a thickness of 200 nm. A silicon-containing anti-reflective coating film composition (SiARC) that was prepared according to the general procedure of EP2597518A2 (Rao et. al.) was applied onto the underlayer film, and then baked at 240° C. for 60 sec. to form a SiARC film having a thickness of 35 nm. Hexamethyldisilazane was applied to the SiARC film prior to being coated with a photoresist. A layer of a positive tone photoresist, EPIC™3013 (available from Dow Electronic Materials), was coated on the SiARC film and baked at 100° C. for 60 sec. to form a photoresist film having a thickness of 120 nm. The photoresist layer was exposed with ASML1100 (available from ASML) ArF dry exposure tool, using the exposure condition of numerical aperture=0.75, dipole-35, inner/outer sigma=0.89/0.64, with 6% half tone phase shift mask with various mask line width at 180 nm pitch. The exposed wafer was baked at 100° C./60 sec. and developed with MF-CD26™ developer (Dow Electronic Materials). All the coating, baking and development were conducted using ACT8 Clean Track from Tokyo Electron. The patterned wafers were treated with a series of etching to transfer photoresist images into the aromatic resin underlayer using Plasma-Therm 790 RIE (Plasma Therm Co.), and etch conditions are indicated in Table 8. FIG. 1A shows top down scanning electron microscope images of the patterns after photoresist imaging, SiARC open etching, SOC open etching and silicon open etching. FIG. 1B shows a cross-section scanning electron microscope image of the transferred pattern having 54 nm lines (180 nm pitch) after Si open etching. As FIGS. 1A and 1B show, the underlayer formed from Formulation 1 was able to produce fine patterns through the etch pattern transfer process.

TABLE 8

| | Process | | | |
|---|---|---|---|---|
| | Trim | SiARC | SOC | Si |
| | Gas | | | |
| | $Ar/O_2$ | $CF_4/O_2$ | $Ar/O_2$ | $CF_4/CHF_3/Ar$ |
| Flow(sscm) | 60 | 72/2 | 60/20 | 20/20/20 |
| Power(W) | 300 | 100 | 300 | 500 |
| Pressure (mT) | 10 | 20 | 10 | 10 |
| Time (s) | 4 | 120 | 134 | 180 |

Example 19

Figure 2A:
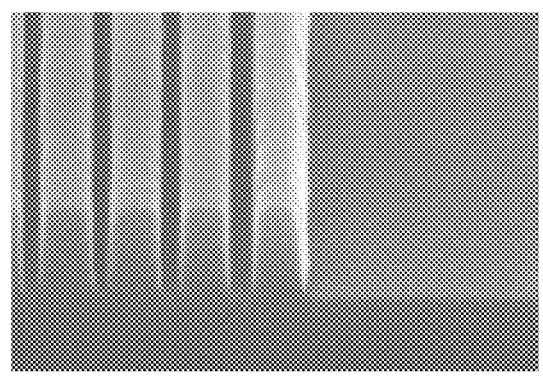
FIG. 2A is a cross-sectional scanning electron micrograph (SEM) image of a template used in Example 19 and FIG. 2B is a cross-sectional SEM image illustrating the height differential within a film formed from the compositions of the invention.
Figure 2B:
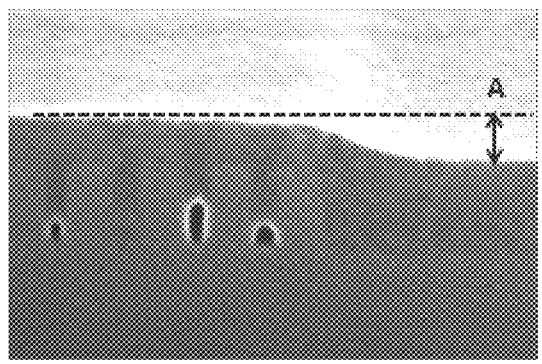

Gap filling and planarization properties of the present formulations were evaluated using a template with trench patterns made of $SiO_2$ on a silicon substrate. The pattern dimension was 20 nm trench at 84 nm pitch and 100 nm height. A cross-sectional image of the template taken by scanning electron microscope at 200 k magnification is shown in FIG. 2A. Formulations 1-9 and Comparative 1 were spin-coated on the template and baked at 350° C. for 60 sec. Comparative 2 was spin-coated on the template and baked at 240° C. for 60 sec. Gap filling and planarization were evaluated by inspecting cross-section SEM images (200 k magnification) of the templates. If bubbles or voids were observed in the trench patterns, the gap filling property of such formulation was considered to "fail". If there no bubbles or voids were observed in the trench patterns, the gap filling property was considered to "pass". Planarization was evaluated by measuring film thickness difference between the highest point and the lowest point of a film, as indicated by "A" in FIG. 2B. If the film thickness difference "A" was <20 nm, the planarization property of the film was considered to "pass", and if the film thickness difference "A" was >20 nm, the planarization property was considered to "fail".

TABLE 9

| Formulation | Gap Fill | Planarization |
|---|---|---|
| 1 | Pass | Pass |
| 2 | Pass | Pass |
| 3 | Pass | Pass |
| 4 | Pass | Pass |
| 5 | Pass | Pass |
| 6 | Pass | Pass |
| 7 | Pass | Pass |
| 8 | Pass | Pass |
| 9 | Pass | Pass |
| Comparative 1 | Pass | Pass |
| Comparative 2 | Fail | Fail |

What is claimed is:

1. A process of forming a patterned layer comprising:
(a) coating on a substrate a layer of a composition comprising (i) a polyarylene resin comprising as polymerized units: one or more first monomers of formula (1)

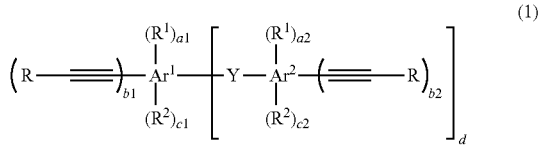

wherein each $Ar^1$ and $Ar^2$ is independently a $C_{6-30}$-aryl moiety; each R is independently H, $C_{6-30}$-aryl, or substituted $C_{6-30}$-aryl; each $R^1$ is independently —OH, $C_{1-6}$-hydroxyalkyl, —C(=O)OR$^3$, —C(=O)N(R$^4$)$_2$, —O—C(=O)R$^5$, —NR$^4$C(=O)R$^6$, —N(R$^4$)$_3^+$ An$^-$, —NO$_2$; S(=O)$_2$—OR$^7$, —O—S(=O)$_2$—R$^8$, —NR$^4$—S(=O)$_2$—R$^6$, or S(=O)$_2$—N(R$^4$)$_2$; each $R^2$ is independently $C_{1-10}$-alkyl, $C_{1-10}$-haloalkyl, $C_{1-10}$-hydroxyalkyl, $C_{1-10}$-alkoxy, CN, —N(R$^4$)$_2$, or halogen; $R^3$ is H, $C_{1-10}$-alkyl, $C_{1-10}$-hydroxyalkyl, $C_{1-10}$-aminoalkyl, $C_{6-30}$-aryl, or M; each $R^4$ is independently H, $C_{6-30}$-aryl or $C_{1-10}$-alkyl; each $R^5$ is independently H, $C_{1-10}$-alkyl, $C_{1-10}$-hydroxyalkyl, $C_{6-30}$-aryl, —O(C$_{1-10}$-alkyl), —O(C$_{6-10}$-aryl), or —N(R$^4$)$_2$; $R^6$ is H, $C_{1-10}$-alkyl, $C_{1-10}$-hydroxyalkyl, $C_{6-30}$-aryl, —O(C$_{1-10}$-alkyl), or —NH(C$_{1-10}$-alkyl); $R^7$ is H, $C_{1-10}$-alkyl, $C_{6-30}$-aryl, or M; $R^8$ is $C_{6-30}$-aryl, $C_{1-10}$-alkyl, or $C_{1-10}$-haloalkyl; M is an alkali metal ion, an alkaline earth metal ion, or an ammonium ion; An$^-$ is a halide anion or a $C_{1-20}$-carboxylate anion; each Y is independently a single chemical bond or a divalent linking group which divalent linking group is —O—, —S—, —S(=O)—, —S(=O)$_2$—, —C(=O)—, —(C(R$^9$)$_2$)$_z$—, $C_{6-30}$-aryl, or —(C(R$^9$)$_2$)$_{z1}$—(C$_{6-30}$-aryl)-(C(R$^9$)$_2$)$_{z2}$—; each $R^9$ is independently H, hydroxy, halogen, $C_{1-10}$-alkyl, $C_{1-10}$-haloalkyl, or $C_{6-30}$-aryl; a1=0 to 3; a2=0 to 3; b1=1 to 4; b2=0 to 2; c1=0 to 2; c2=0 to 2; a1+a2=1 to 6; b1+b2=2 to 6; c1+c2=0 to 6; d=0 to 2; z=1 to 10; z1=0 to 10; z2=0 to 10; and z1+z2=1 to 10; and one or more second monomers comprising two or more cyclopentadienone moieties; and one or more organic solvents;
(b) removing organic solvent to form an aromatic resin layer;
(c) coating a layer of a photoresist on the aromatic resin layer;
(d) exposing the photoresist layer to actinic radiation through a mask;
(e) developing the exposed photoresist layer to form a resist pattern; and
(f) transferring the pattern to the aromatic resin layer to expose portions of the substrate.

2. The method of claim 1 further comprising the steps of patterning the substrate; and then removing the patterned aromatic resin layer.

3. The method of claim 1 further comprising the step of coating a silicon-containing layer over the aromatic resin layer before step (c).

4. The method of claim 3 further comprising the step of transferring the pattern to the silicon-containing layer after step (e) and before step (f).

5. The method of claim 1 wherein the polyarylene resin further comprises as polymerized units one or more third monomers of formula (13)

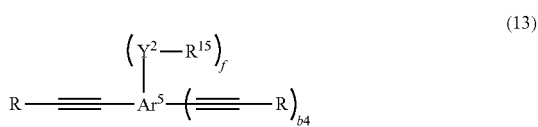

wherein $Ar^5$ is a $C_{6-30}$-aromatic moiety; each $Y^2$ is independently a single chemical bond or a divalent linking group which divalent linking group is —O—, —S—, —S(=O)—, —S(=O)$_2$—, —C(=O)—, —(C(R$^9$)$_2$)$_z$—, $C_{6-30}$-aryl, or —(C(R$^9$)$_2$)$_{z1}$—C$_{6-30}$-aryl or —(C(R$^9$)$_2$)$_{z2}$—; each $R^{15}$ is independently $C_{1-4}$-alkyl, $C_{1-4}$-haloalkyl, $C_{1-4}$-alkoxy, optionally substituted $C_{7-14}$-aralkyl, or optionally substituted $C_{6-30}$-aryl; b4=1 or 2; f=0 to 4; z is 1 to 10; z1 is 0 to 10; z2 is 0 to 10; and z1+z2=1 to 10.

6. The method of claim 5 wherein f=0.

7. The method of claim 1 wherein each $R^1$ is independently —OH, —C(=O)OR$^3$, —C(=O)N(R$^4$)$_2$, —O—C(=O)R$^5$, —S(=O)$_2$—OR$^5$, and —S(=O)$_2$—OR$^7$, or S(O=)$_2$—N(R$^4$)$_2$.

8. The method of claim 7 wherein $R^3$ is H, $C_{1-6}$-alkyl, $C_{1-6}$-hydroxyalkyl, or M; each $R^4$ is independently H or $C_{1-6}$-alkyl; each $R^5$ is H, $C_{1-6}$-alkyl.

9. The method of claim 7 wherein each $R^1$ is independently —OH or —C(=O)OR$^3$.

10. The method of claim 1 wherein the one or more first monomers have the formula (2):

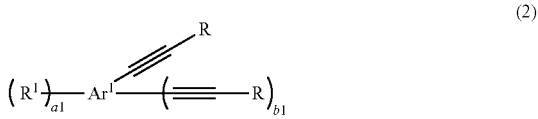

wherein $Ar^1$, R, $R^1$, a1 and b1 are as defined in claim 1.

11. The method of claim 1 wherein $Ar^1$ and $Ar^2$ are independently phenyl, naphthyl, anthracenyl, phenanthryl, pyrenyl, coronenyl, tetracenyl, pentacenyl, triphenylenyl, or perylenyl.

12. The method of claim 1 wherein the one or more second monomers are chosen from one or more monomers of formula (9)

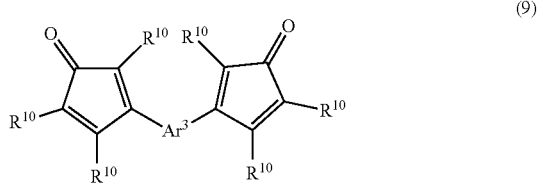

wherein each $R^{10}$ is independently H, phenyl, or substituted phenyl; and $Ar^3$ is an aromatic moiety.

13. The method of claim 1 wherein the one or more organic solvents are propylene glycol methyl ether, propylene glycol methyl ether acetate, methyl 3-methoxypropionate, ethyl lactate, n-butyl acetate, anisole, N-methyl pyrrolidone, gamma-butyrolactone, ethoxybenzene, benzyl propionate, benzyl benzoate, propylene carbonate, methyl 2-hydroxyisobutyrate, cyclohexanone, or a mixture thereof.

14. A process for filling a gap, comprising: (a) providing a semiconductor substrate having a relief image on a surface of the substrate, the relief image comprising a plurality of gaps to be filled; (b) applying a gap-fill composition over the relief image, wherein the gap-fill composition comprises a composition comprising (i) a polyarylene resin comprising as polymerized units: one or more first monomers of formula (1) and one or more second monomers comprising two or more cyclopentadienone moieties;

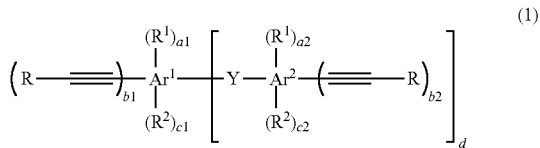

(1)

wherein each $Ar^1$ and $Ar^2$ is independently a $C_{6-30}$-aryl moiety; each R is independently H, $C_{6-30}$-aryl, or substituted $C_{6-30}$-aryl; each $R^1$ is independently —OH, $C_{1-6}$-hydroxyalkyl, —C(=O)$OR^3$, —C(=O)N$(R^4)_2$, —O—C(=O)$R^5$, —$NR^4$C(=O)$R^6$, —N$(R^4)_3{}^+$ An⁻, —NO$_2$; —S(=O)$_2$—$OR^7$, —O—S(=O)$_2$—$R^8$, —$NR^4$—S(=O)$_2$—$R^6$, or S(=O)$_2$—N$(R^4)_2$; each $R^2$ is independently $C_{1-10}$-alkyl, $C_{1-10}$-haloalkyl, $C_{1-10}$-hydroxyalkyl, $C_{1-10}$-alkoxy, CN, —N$(R^4)_2$, or halogen $R^3$ is H, $C_{1-10}$-alkyl, $C_{1-10}$-hydroxyalkyl, $C_{1-10}$-aminoalkyl, $C_{6-30}$-aryl, or M; each $R^4$ is independently H, $C_{6-30}$-aryl, or $C_{1-10}$-alkyl; each $R^5$ is independently H, $C_{1-10}$-alkyl, $C_{1-10}$-hydroxyalkyl, $C_{6-30}$-aryl, —O($C_{1-10}$-alkyl), —O($C_{6-10}$-aryl), or —N$(R^4)_2$; $R^6$ is H, $C_{1-10}$-alkyl, $C_{1-10}$-hydroxy alkyl, $C_{6-30}$-aryl, —O($C_{1-10}$-alkyl), or —NH($C_{1-10}$-alkyl); $R^7$ is H, $C_{1-10}$-alkyl, $C_{6-30}$-aryl, or M; $R^8$ is $C_{6-30}$-aryl, $C_{1-10}$-alkyl, or $C_{1-10}$-haloalkyl; M is an alkali metal ion, an alkaline earth metal ion, or an ammonium ion; An⁻ is a halide anion or a $C_{1-20}$-carboxylate anion; each Y is independently a single chemical bond or a divalent linking group which divalent linking group is —O—, —S—, —S(=O)—, —S(=O)$_2$—, —C(=O)—, —(C$(R^9)_2)_z$—, $C_{6-30}$-aryl, or —(C$(R^9)_2)_{z1}$—($C_{6-30}$-aryl)-(C$(R^9)_2)_{z2}$—; each $R^9$ is independently chosen from H, hydroxy, halo, $C_{1-10}$-alkyl, $C_{1-10}$-haloalkyl, and $C_{6-30}$-aryl; a1=0 to 3; a2=0 to 3; b1=1 to 4; b2=0 to 2; a=0 to 2; c2=0 to 2; a1+a2=1 to 6; b1+b2=2 to 6; c1+c2=0 to 6; d=0 to 2; z=1 to 10; z1=0 to 10; z2=0 to 10; and z1+z2=1 to 10; and (ii) one or more organic solvents; and (c) heating the gap-fill composition at a temperature to cure the polyarylene resin.

* * * * *